US012627249B2

(12) United States Patent
Yu et al.

(10) Patent No.: US 12,627,249 B2
(45) Date of Patent: May 12, 2026

(54) INVERTER APPARATUS USED IN MOTOR CONTROLLER, MOTOR CONTROLLER, AND VEHICLE

(71) Applicant: Huawei Digital Power Technologies Co., Ltd., Shenzhen (CN)

(72) Inventors: Kang Yu, Shenzhen (CN); Weilong Zhang, Xi'an (CN); Ming Sun, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 149 days.

(21) Appl. No.: 18/430,324

(22) Filed: Feb. 1, 2024

(65) Prior Publication Data

US 2024/0266980 A1 Aug. 8, 2024

(30) Foreign Application Priority Data

Feb. 7, 2023 (CN) .......................... 202320273722.9

(51) Int. Cl.
*H02P 27/06* (2006.01)
*B60L 15/00* (2006.01)
*H05K 7/20* (2006.01)

(52) U.S. Cl.
CPC ............ *H02P 27/06* (2013.01); *B60L 15/007* (2013.01); *H05K 7/209* (2013.01)

(58) Field of Classification Search
CPC .... H02P 27/06; H05K 7/209; H05K 7/20927; H02M 7/003
See application file for complete search history.

(56) References Cited

U.S. PATENT DOCUMENTS

| | | | |
|---|---|---|---|
| 2003/0179596 A1 | 9/2003 | Joseph et al. | |
| 2019/0319551 A1 | 10/2019 | Song et al. | |
| 2023/0208309 A1* | 6/2023 | Rambow | H02M 7/003 |
| | | | 363/141 |

FOREIGN PATENT DOCUMENTS

| | | | |
|---|---|---|---|
| CN | 111800986 A | 10/2020 | |
| EP | 3493387 A2 * | 6/2019 | ......... H02M 7/5387 |
| WO | 2013140704 A1 | 9/2013 | |

* cited by examiner

*Primary Examiner* — Muhammad S Islam
(74) *Attorney, Agent, or Firm* — WOMBLE BOND DICKINSON (US) LLP

(57) ABSTRACT

This application provides an inverter apparatus used in a motor controller, a motor controller, and a vehicle. The inverter apparatus includes a capacitor module, a power module, and a first heat sink. The power module includes a plurality of power transistors, and the plurality of power transistors are arranged in a flat manner in a direction perpendicular to a direction in which the power module and the first heat sink are stacked. The first heat sink is configured to dissipate heat for the power transistors in the power module, so that the power transistors operate in a proper temperature environment. The inverter apparatus provided in this application has a compact structure layout and high integration. This is conducive to implementing a miniaturization embodiment of the motor controller, and reducing difficulty of disassembling and assembling internal parts of the motor controller and costs.

18 Claims, 16 Drawing Sheets

4

400 (4000)

410

4200 (4001)

X

4

4002    4003    410

4000

430 { 4310
      4300
      4320

4001    4200    420    4010

D2  D1

X
Y
Z

4

4

INVERTER APPARATUS USED IN MOTOR CONTROLLER, MOTOR CONTROLLER, AND VEHICLE

CROSS-REFERENCE TO RELATED APPLICATIONS

This application claims priority to Chinese Patent Application No. 202320273722.9, filed on Feb. 7, 2023, which is hereby incorporated by reference in its entirety.

TECHNICAL FIELD

This application relates to the field of motor controller technologies, and in particular, to an inverter apparatus used in a motor controller, a motor controller, and a vehicle.

BACKGROUND

A motor controller in an electric vehicle is used to convert a direct current provided by a power battery into an alternating current to supply power to a drive motor, to drive wheels of the electric vehicle by using the drive motor.

However, the motor controller implements conversion between an alternating current voltage and a direct current voltage by switching between a turn-on state and a turn-off state of a power module. Frequent turn-on and turn-off of the power module generate a large amount of heat. Generally, a heat sink needs to be disposed inside the motor controller to dissipate heat for the power module. In addition, the heat sink usually uses cooling liquid to improve a heat dissipation capability and needs to dissipate heat for a circuit device such as a capacitor. Consequently, an internal structure of the motor controller is complex and the motor controller has a large size. This not only affects an entire vehicle layout, but also causes complex maintenance, disassembly, and assembly operations of the motor controller.

SUMMARY

This application provides an inverter apparatus that has a compact structure layout and that can reduce disassembly and assembly difficulty, a motor controller, and a vehicle.

According to a first aspect, this application provides an inverter apparatus used in a motor controller. The inverter apparatus includes a capacitor module, a power module, and a first heat sink, where the power module and the first heat sink are disposed in a stacked manner on the capacitor module. The power module includes a plurality of power transistors, and the plurality of power transistors are arranged in a flat manner in a direction perpendicular to a direction in which the power module and the first heat sink are stacked.

In this embodiment, the direction in which the power module and the first heat sink are stacked is a first direction, and the power module and the first heat sink are stacked in the first direction. The plurality of power transistors are arranged in a flat manner in the direction perpendicular to the first direction. That is, the plurality of power transistors are arranged in a flat manner in a plane perpendicular to the first direction. In an embodiment, the plane perpendicular to the first direction may be a surface that is of the first heat sink and that faces the power module in the first direction. Compared with a manner in which the plurality of power transistors are disposed in a stacked manner in the first direction, this solution is conducive to reducing a length of the inverter apparatus in the first direction, and effectively utilizing a mounting area of the first heat sink, so as to implement a miniaturization embodiment of the motor controller.

In this embodiment, the power module is electrically connected to the capacitor module, and the power module is configured to convert a direct current into an alternating current. The direct current transmitted to the inverter apparatus sequentially flows to the capacitor module and the power module. The capacitor module is configured to receive the direct current. An output terminal of the capacitor module is electrically connected to an input terminal of the power module. The direct current is transmitted to the power module through the capacitor module and then converted into the alternating current. An output terminal of the power module is electrically connected to an input terminal of a motor. The power module transmits the alternating current to the motor to drive the motor to run.

In this embodiment, the first heat sink is configured to dissipate heat for the power module. The first heat sink and the power module are disposed in a stacked manner. When cooling liquid flows into the first heat sink, the cooling liquid can exchange heat with the power module, and the first heat sink takes the heat away from the power module, so as to reduce a temperature of the inverter apparatus in a stable working state, thereby implementing temperature control on the motor controller.

In this application, the inverter apparatus has a compact structure layout. The inverter apparatus is used in the motor controller. This improves integration of the motor controller, and is conducive to implementing a miniaturization embodiment of the motor controller and optimizing an entire vehicle layout. Compared with a manner in which the capacitor module, the power module, and the first heat sink are arranged in a flat manner side by side, in this application, the power module and the first heat sink are disposed in a stacked manner on a side of the capacitor module, and the power transistors are arranged in a flat manner in the plane perpendicular to the direction in which the power module and the first heat sink are stacked, so that a size of the motor controller can be reduced. In addition, the capacitor module, the power module, and the first heat sink are pre-assembled into the inverter apparatus, so that parts inside the motor controller are modularized. When the motor controller needs to be reprocessed or maintained, the parts do not need to be disassembled and assembled one by one, so that the motor controller can be quickly assembled and disassembled, thereby reducing operation difficulty and costs.

In an embodiment, the first heat sink is disposed in a stacked manner on the capacitor module, the power module is disposed in a stacked manner on a side that is of the first heat sink and that is away from the capacitor module, and the plurality of power transistors are arranged in a flat manner on the first heat sink.

In this embodiment, the capacitor module, the first heat sink, and the power module are sequentially disposed in a stacked manner in the first direction, and the first heat sink is located between the power module and the capacitor module, so that the cooling liquid in the first heat sink can simultaneously perform heat exchange with the power module and the capacitor module. This is conducive to improving utilization of the cooling liquid and optimizing cooling efficiency of the first heat sink. In some embodiments, the power module may alternatively be disposed between the first heat sink and the capacitor module. In this case, the first heat sink can perform cooling and heat dissipation on the power module and a component such as a circuit board that is located above the first heat sink.

In an embodiment, the capacitor module includes a mounting surface, the mounting surface is used for mounting a component, and orthographic projections of the power module and the first heat sink on the mounting surface are located in the mounting surface. In this embodiment, the mounting surface of the capacitor module is one of the largest surfaces of the capacitor module. This solution is conducive to reducing a size occupied by the inverter apparatus.

In an embodiment, a first fastener is disposed on an edge of the mounting surface, a second fastener is disposed on an edge of the first heat sink, and the first fastener and the second fastener are fastened in a cooperative manner, so that the first heat sink is fastened to the capacitor module.

In this embodiment, the first fastener and the second fastener are fastened in a cooperative manner in the first direction. A fastening manner of the first fastener and the second fastener is not limited. For example, the fastening manner may be connection by using a screw, a clip, or a weld assembly. In an embodiment, the second fastener may be a positioning hole, an inner wall of the positioning hole has no thread, and the first fastener is a screw hole. A screw runs through the screw hole and the positioning hole and is connected, in a threaded manner, to a component located below the capacitor module. For example, the screw runs through the screw hole and the positioning hole and is fastened to a fastener in a motor controller housing in a threaded connection manner. In this case, the positioning hole is used for positioning. In some embodiments, threads may be disposed in the positioning hole, so that the first fastener is connected to the positioning hole in a threaded manner.

In this solution, the first fastener and the second fastener are disposed in the capacitor module and the first heat sink respectively, so that the capacitor module is fastened to the first heat sink. This is conducive to improving overall structural stability of the inverter apparatus. When an external environment exerts an external force on the inverter apparatus, a fixed connection relationship between the first fastener and the second fastener alleviates impact caused by the external environment on the inverter apparatus.

In an embodiment, first heat sink avoidance holes are provided in two sides of the mounting surface in a second direction. First heat sink interfaces are disposed on a side that is of the first heat sink and that is close to the mounting surface in the first direction. The first heat sink interfaces protrude toward the mounting surface in the first direction and are disposed in correspondence with the first heat sink avoidance holes in the first direction. The first heat sink interfaces are configured to communicate with a waterway in the motor controller housing, so that cooling liquid in the motor controller housing can flow in the first heat sink. In this solution, the first heat sink avoidance holes and the first heat sink interfaces are provided. This is conducive to auxiliary positioning when the first heat sink and the capacitor module are fastened, and enhancing reliability of a fixed connection.

In an embodiment, the inverter apparatus further includes a sheet metal clip, two ends of the sheet metal clip are respectively clamped and fastened to the power module and the capacitor module, and the sheet metal clip is configured to fasten the power module, the first heat sink, and capacitor module in the direction in which the power module and the first heat sink are stacked.

In this embodiment, because the first heat sink is located between the power module and the capacitor module in the first direction, the sheet metal clip is disposed in the inverter apparatus, and this is conducive to reinforcing a connection relationship between the capacitor module and the first heat sink. The capacitor module, the first heat sink, and the power module are fastened through the sheet metal clip. This is conducive to improving overall structural stability of the inverter apparatus. When an external environment exerts an external force on the inverter apparatus, the sheet metal clip is disposed to alleviate impact caused by the external environment on the inverter apparatus. In this embodiment, a clip made of a sheet metal material is used, so that fastening strength is greater, and fastening strength of the capacitor module, the first heat sink, and the power module is improved.

In an embodiment, two first fasteners are disposed on one side edge of the mounting surface in the second direction, and the sheet metal clip is located between the two first fasteners in a third direction. In this embodiment, the sheet metal clip, one of the first fasteners, and one of the second fasteners are disposed on a same side of the mounting surface. The third direction is parallel to the mounting surface and is perpendicular to the second direction. In this solution, a layout between different devices and structures is compact. This is conducive to reducing a size of the inverter apparatus.

In an embodiment, the sheet metal clip includes a clip body, and a first protruding part and a second protruding part that are located on two ends of the clip body. The clip body extends in the first direction, and the first protruding part is clamped and fastened to a side that is of the power module and that is away from the capacitor module in the first direction. The second protruding part is in a "C" shape, and the second protruding part is clamped and fastened to an edge of a capacitor housing. The first protruding part and the second protruding part exert acting forces to the power module and the capacitor module respectively. This is conducive to reinforcing a connection relationship between the first fastener of the capacitor module and the second fastener of the first heat sink.

In an embodiment, the inverter apparatus includes a plurality of groups of first power terminals, each group of the first power terminals includes at least one first power terminal, each of the first power terminals is configured to connect to one of the power transistors and the capacitor module, and the plurality of first power terminals are sequentially arranged along a side of the first heat sink.

In this embodiment, the power transistor is electrically connected to the capacitor module through the first power terminal, and the direct current is transmitted from the capacitor module to the power transistor through the first power terminal. The plurality of first power terminals are arranged in the second direction, and a side of the first heat sink in the second direction is a long side of the first heat sink. In this solution, the plurality of first power terminals are sequentially arranged along the long side of the first heat sink. This is conducive to improving space utilization of the inverter apparatus.

In an embodiment, the capacitor module further includes a plurality of capacitor connection terminals, each of the capacitor connection terminals is configured to connect to one of the power transistors, the plurality of capacitor connection terminals are arranged on an upper surface of the capacitor module along the first heat sink, orthographic projections of the capacitor connection terminals and the first heat sink on the upper surface of the capacitor module do not overlap, and the upper surface of the capacitor module is a surface that is of the capacitor module and that faces the first heat sink.

In this embodiment, the first power terminal is electrically connected to the capacitor connection terminal. The power transistor is electrically connected to the capacitor module through the first power terminal and the capacitor connection terminal, and the direct current is transmitted from the capacitor module to the power transistor through the capacitor connection terminal and the first power terminal.

In this embodiment, the upper surface of the capacitor module may also be referred to as the mounting surface of the capacitor module. The capacitor connection terminal is located on the mounting surface and extends in the first direction, and orthographic projections of the capacitor connection terminal and the first heat sink on the mounting surface do not overlap. The first power terminal protrudes from the power transistor to the capacitor module.

In an embodiment, the capacitor connection terminal and the first power terminal are vertically and correspondingly disposed in the first direction. The capacitor connection terminal is located on one side edge of the mounting surface in the third direction, and the first power terminal is located on a side of the power module in the third direction. Because the first heat sink is located between the capacitor module and the power module in the first direction, the following setting is performed: Projections of the capacitor connection terminals and the first heat sink in the first direction do not overlap, so that the capacitor module is not blocked by the first heat sink in a process of being electrically connected to the power module, and the size of the inverter apparatus may not be increased additionally, so that the inverter apparatus is more miniaturized.

In an embodiment, when the capacitor connection terminal and the first power terminal are vertically disposed, the capacitor connection terminal and the first power terminal may be welded through a laser on side edges of the capacitor module and the first heat sink, so that the capacitor connection terminal and the first power terminal are fastened.

In an embodiment, the capacitor module further includes a capacitor housing and a capacitor body located inside the capacitor housing, and one end of the capacitor connection terminal is located in the capacitor housing and is electrically connected to the capacitor body.

In this embodiment, the capacitor body plays a role of filtering the direct current, and the capacitor body is electrically connected to the capacitor connection terminal. The direct current that has been filtered is transmitted to the power transistor through the capacitor connection terminal and the first power terminal, and the power transistor implements a direct current-alternating current conversion function.

In an embodiment, a metal connection layer is disposed between the first heat sink and the power module, the metal connection layer is fastened to both the first heat sink and the power module, and two surfaces that are of the metal connection layer and that are disposed opposite to each other in the direction in which the power module and the first heat sink are stacked are in contact with the first heat sink and power module respectively.

In this embodiment, two surfaces that are of the metal connection layer and that are opposite to each other in the first direction are a first heat sink connection surface and a power module connection surface respectively. The first heat sink is in contact with and fastened to the first heat sink connection surface of the metal connection layer, and the power module is in contact with and fastened to the power module connection surface of the metal connection layer, so that the first heat sink is also fastened to the power module, and the first heat sink is simultaneously fastened to the capacitor module through the first fastener and the second fastener. Therefore, overall structural stability of the inverter apparatus is ensured.

In this embodiment, heat generated by the power module is transferred to the cooling liquid in the first heat sink through the metal connection layer. In an embodiment, the metal connection layer between the power module and the first heat sink is made of a high heat conduction material, including but not limited to copper, aluminum, or an alloy of copper and aluminum. Compared with use of a conventional thermal interface material (TIM) or solder, the metal connection layer in this solution is more conducive to reducing thermal resistance of a heat dissipation path in the inverter apparatus, and improving cooling efficiency of the first heat sink.

In an embodiment, the inverter apparatus further includes a second heat sink, and the second heat sink is disposed in a stacked manner on a side that is of the power module and that is away from the first heat sink. In this embodiment, the power module is located between the second heat sink and the first heat sink in the first direction. The second heat sink is located on a side that is of the power module and that is away from the capacitor module in the first direction, and the first heat sink is located on a side that is of the power module and that is close to the capacitor module in the first direction. The first heat sink and the second heat sink form double-sided heat dissipation for the power module. The cooling liquid in the first heat sink and the second heat sink exchanges heat with the power module in opposite directions. A contact area between the cooling liquid and the power module is large. This is conducive to improving cooling efficiency of the first heat sink.

In an embodiment, a first metal connection layer is disposed between the power module and the second heat sink, and the power module is fastened to the second heat sink through the first metal connection layer. A second metal connection layer is disposed between the power module and the first heat sink, and the power module is fastened to the first heat sink through the second metal connection layer.

In an embodiment, the second heat sink and the power module may be bonded and fastened through a thermally conductive adhesive. A mounting process of bonding and fastening by using the thermally conductive adhesive is simpler and safer.

In an embodiment, the inverter apparatus includes a first circuit board, the power module and the first heat sink are disposed in a stacked manner between the capacitor module and the first circuit board, and the first circuit board is electrically connected to the plurality of power transistors. In this embodiment, the first circuit board is configured to control the power transistor to convert the direct current into the alternating current. The capacitor module, a heat dissipation power module, first heat dissipation power module, and the first circuit board are disposed in a stacked manner in the first direction. The inverter apparatus is compact in an overall layout, and occupies a small size in another direction. This is conducive to implementing a miniaturization embodiment of the inverter apparatus. In addition, the first circuit board is integrated into the inverter apparatus, so as to improve a modularization degree of internal devices of the motor controller. This is conducive to reducing difficulty of disassembling and assembling the motor controller and costs.

In an embodiment, the power module further includes a signal terminal. The signal terminal is located on a side that is of the power module and that is opposite to the first power terminal, and extends to the first circuit board. The first circuit board sends a control signal to the power module by using the signal terminal, so that the power module implements an alternating current-direct current conversion function.

In an embodiment, the second heat sink is located between the first circuit board and the power module in the first direction. In this solution, the second heat sink can simultaneously perform cooling and heat dissipation on the first circuit board and the power module.

In an embodiment, the upper surface of the capacitor module includes a plurality of first support columns, and the plurality of first support columns are configured to fasten the first circuit board and the capacitor module. In the direction in which the power module and the first heat sink are stacked, a height of each of the first support columns is greater than or equal to a stacked height of the power module and the first heat sink. The plurality of first support columns are sequentially arranged along a side of the first heat sink, and orthographic projections of the plurality of first support columns and the first heat sink on the upper surface of the capacitor module do not overlap.

In this embodiment, the first support column extends in the first direction, one end of the first support column is fastened to the upper surface of the capacitor module, and the other end of the first support column is fastened to the first circuit board.

In this embodiment, because the first support column needs to be fastened to the first circuit board, the following setting is performed in this solution: In the direction in which the power module and the first heat sink are stacked, the height of each of the first support columns is greater than or equal to the stacked height of the power module and the first heat sink, so that mounting space can be provided for a connection between the capacitor module and the first circuit board, thereby reducing operation difficulty.

In this embodiment, because the first heat sink is located between the first circuit board and the capacitor module in the first direction, the following setting is performed: Projections of the first support columns and the first heat sink in the first direction do not overlap, so that the first circuit board is not blocked by the first heat sink in a process of fixedly connecting to the capacitor module.

In an embodiment, circuit board fixing holes are provided in an edge of the first circuit board, and the first support columns are inserted into the circuit board fixing holes in the first direction, to implement a fixed connection between the capacitor module and the edge of the first circuit board. The capacitor module is fastened to the first circuit board, so that positions of the power module and the first heat sink that are located between the capacitor module and the first circuit board are also fixed, and an overall structure of the inverter apparatus is stable. When an external environment exerts an external force on the motor controller, the inverter apparatus is not easily displaced in the motor controller. This is conducive to working in a stable state by the inverter apparatus.

In an embodiment, the inverter apparatus includes a second circuit board, and the second circuit board and the power module are disposed side by side between the capacitor module and the first circuit board. In this embodiment, the second circuit board is located on a side of the power module in the third direction, and the second circuit board and the power module are disposed side by side. In addition, the second circuit board is located on a side that is of the first circuit board and that faces the capacitor module, and there is no stacking relationship between the second circuit board and the power module in the first direction. In this solution, the second circuit board is disposed in the inverter apparatus, and can provide a basis for an electrical connection between the power module and another device.

In an embodiment, the second circuit board, the first circuit board, the capacitor module, and the power module are jointly configured to implement power conversion in the inverter apparatus.

In an embodiment, an upper surface of the capacitor module includes a plurality of second support columns, the inverter apparatus includes a second circuit board, and the plurality of second support columns are configured to fasten the second circuit board and the capacitor module, where in the direction in which the power module and the first heat sink are stacked, a height of each of the second support columns is less than a stacked height of the power module and the first heat sink; and the plurality of second support columns are sequentially arranged along the other side of the first heat sink, and orthographic projections of the plurality of second support columns and the first heat sink on the upper surface of the capacitor module do not overlap.

In this embodiment, because the first heat sink is located between the second circuit board and the capacitor module in the first direction, the second circuit board cannot be directly and fastened to the mounting surface of the capacitor module. Therefore, the second support columns are disposed on the mounting surface, so as to compensate for a spacing between the second circuit board and the mounting surface. Because the second circuit board is located between the first circuit board and the capacitor module in the first direction, the following setting is performed in this solution: In the direction in which the power module and the first heat sink are stacked, the height of each of the second support columns is less than the stacked height of the power module and the first heat sink, so that the second support columns can more smoothly fasten the second circuit board and the capacitor module together, thereby reducing difficulty of a mounting operation.

In this embodiment, the second support column is located on a side that is of the mounting surface and that is opposite to the first support column. Because the first heat sink is located between the second circuit board and the capacitor module in the first direction, the following setting is performed: Projections of the second support columns and the first heat sink in the first direction do not overlap, so that the second circuit board is not blocked by the first heat sink in a process of fixedly connecting to the capacitor module by using the second support columns.

In an embodiment, a support column positioning part and a support column fixing hole are provided on the second support column. A second circuit board positioning hole and a second circuit board fixing hole are respectively provided in the second circuit board in correspondence with the support column positioning part and the support column fixing hole in the first direction. The support column positioning part runs through the second circuit board positioning hole to implement a positioning function, and then the support column fixing hole and the second circuit board fixing hole are sequentially connected through a screw, so as to fasten the second support column and the second circuit board.

In an embodiment, the second support columns and the capacitor housing are integrally formed. In this solution, a connection between the second circuit board and the capacitor module is more stable. This is conducive to improving stability of an overall structure of the inverter apparatus.

In an embodiment, there are a plurality of copper bar connectors between a surface that is of the second circuit board and that faces the capacitor module and the upper surface of the capacitor module, and each of the copper bar connectors is electrically connected to one of the power transistors. In this embodiment, two ends of the copper bar connector extend to two sides of the second circuit board in the third direction. The power module includes a second power terminal, the second power terminal is electrically connected to the power transistor, and the second power terminal is an output terminal of the power module. The copper bar connector is electrically connected to the second power terminal and a three-phase copper bar assembly separately. The power module is electrically connected to the three-phase copper bar assembly through the second circuit board. The direct current transmitted by the capacitor module is converted into the alternating current through the power module, and then the alternating current is transmitted to the motor sequentially through the second circuit board and the three-phase copper bar assembly.

According to a second aspect, this application provides a motor controller, where the motor controller includes a motor controller housing, the inverter apparatus according to any embodiment of the first aspect, and a three-phase copper bar assembly, and the motor controller housing is configured to accommodate the inverter apparatus and the three-phase copper bar assembly, where the motor controller housing includes a bottom housing and a cover plate, the inverter apparatus is disposed between the bottom housing and the cover plate, and the capacitor module is fastened to the bottom housing; and the inverter apparatus and the three-phase copper bar assembly are arranged in parallel in the motor controller housing in a direction perpendicular to a direction in which the power module and the first heat sink are stacked.

In this embodiment, the cover plate is located on a side that is of the inverter apparatus and the three-phase copper bar assembly and that is away from the bottom housing in the first direction. The cover plate and the bottom housing are fastened and form accommodation space through enclosure. One end of the three-phase copper bar assembly and the inverter apparatus are located in the accommodation space. The motor controller housing is configured to: protect internal devices and isolate the internal devices from an external environment.

In an embodiment, the capacitor module is fastened to the bottom housing, so that the first heat sink and the power module that are fastened to the capacitor module are also fastened to the bottom housing. When the motor controller is affected by an external force, a fixed connection relationship enables the inverter apparatus to be free from impact of an external environment.

In an embodiment, the first heat sink is fastened to the bottom housing, to fasten the capacitor module between the bottom housing and the first heat sink.

In an embodiment, the inverter apparatus and the three-phase copper bar assembly are disposed side by side in a plane perpendicular to the first direction. Because devices in the inverter apparatus are disposed in a stacked manner in the first direction, when the three-phase copper bar assembly is fastened in the motor controller housing, a mounting operation of the inverter apparatus is not affected.

In an embodiment, a side wall of the motor controller housing includes a copper bar assembly mounting hole. One end of the three-phase copper bar assembly extends into the bottom housing through the copper bar assembly mounting hole and is electrically connected to the plurality of power transistors by using a plurality of output copper bar connectors. Orthographic projections of the copper bar assembly mounting hole, the first heat sink, and the capacitor module on a side wall do not overlap.

In this embodiment, the three-phase copper bar assembly runs through the copper bar assembly mounting hole, and is fastened on an outer side of a side wall of the bottom housing. Two ends of the three-phase copper bar assembly in a second direction are electrically connected to the second circuit board and the motor respectively. The power module transmits an alternating current to the motor by using the second circuit board and the three-phase copper bar assembly.

In this embodiment, projections of the copper bar assembly mounting hole, the first heat sink, and the capacitor module in the second direction do not overlap, so that projections of the three-phase copper bar assembly and the capacitor module in the second direction do not overlap. Because currents flowing through the capacitor module and the three-phase copper bar assembly are a direct current and an alternating current respectively, in this solution, a high-voltage direct current and a high-voltage alternating current in the motor controller can be electrically shielded. This is conducive to improving electromagnetic compatibility of the motor controller.

In an embodiment, the bottom housing includes a cooling liquid inlet, a cooling liquid outlet, and a housing waterway, and the cooling liquid outlet and the three-phase copper bar assembly are located on a same side of the inverter apparatus. One end of the cooling liquid inlet and one end of the cooling liquid outlet communicate with an external cooling system, and one end of the cooling liquid inlet and one end of the cooling liquid outlet communicate with the housing waterway.

In this embodiment, cooling liquid enters the housing waterway from the cooling liquid inlet, then flows through the first heat sink, exchanges heat with the power module and the capacitor module, and finally flows out of the motor controller from the cooling liquid outlet. The cooling liquid outlet and the three-phase copper bar assembly are disposed on the same side of the inverter apparatus, so that the inverter apparatus has a more compact structure and mounting on the same side is facilitated.

In an embodiment, the motor controller further includes a direct current filter. The direct current filter is configured to: receive the direct current, filter the direct current, and transmit the filtered direct current to the capacitor module. The direct current filter and the three-phase copper bar assembly are located on different sides of the inverter apparatus.

In this embodiment, the direct current filter is fastened to the bottom housing. The direct current filter and the capacitor module are used in a cooperative manner to perform filtering processing on the direct current input to the motor controller. The direct current filter is located on a side of the inverter apparatus in the second direction, and the three-phase copper bar assembly is located on the other side of the inverter apparatus in the second direction. This is conducive to reducing electrical interference generated between the direct current filter and the three-phase copper bar assembly.

In an embodiment, the capacitor module includes a capacitor module copper bar assembly. The capacitor module copper bar assembly is located on a side of the capacitor module in the second direction. The direct current filter is electrically connected to the capacitor module by using the capacitor module copper bar assembly. This solution illustrates an example manner of electrically connecting the capacitor module to the direct current filter.

In an embodiment, a direct current input interface is disposed on a side that is outside the bottom housing and that is close to the direct current filter. The direct current input interface and the direct current filter are correspondingly disposed in the second direction. The direct current input interface is configured to electrically connect to a power battery.

In this embodiment, the direct current input interface, the cooling liquid outlet, and the copper bar assembly mounting hole are located on two opposite sides of the bottom housing in the second direction. The direct current transmitted by the power battery is transmitted to the direct current filter and the capacitor module through the direct current input interface, and the direct current filter and the capacitor module are configured to filter harmonics in the direct current. In this solution, the direct current input interface is disposed, so that the motor controller can receive, by using the direct current input interface, the direct current transmitted by the power battery, and further convert the direct current into the alternating current, and provide the alternating current for the motor.

In this application, the inverter apparatus integrates the capacitor module, the first heat sink, and the power module, and integrates the first circuit board and the second circuit board, so that the inverter apparatus is modularized. This is conducive to simplifying a mounting process of the motor controller, implementing quick assembly and disassembly of the motor controller, and reducing operation difficulty and costs. In addition, the capacitor module, the first heat sink, the power module, and the first circuit board are disposed and fastened in a stacked manner in a perpendicular direction, so that the motor controller is more miniaturized, thereby helping optimize an entire vehicle layout.

According to a third aspect, this application provides a vehicle, where the vehicle includes a motor and the motor controller according to any embodiment of the second aspect, and the three-phase copper bar assembly is electrically connected to the motor.

BRIEF DESCRIPTION OF DRAWINGS

To describe technical solutions in embodiments of this application more clearly, the following describes accompanying drawings used in embodiments of this application.

DESCRIPTION OF EMBODIMENTS

The following describes technical solutions in embodiments of this application with reference to accompanying drawings in embodiments of this application. It is clear that the described embodiments are merely some rather than all of embodiments of this application.

Terms "first", "second", and the like in this specification are merely intended for a purpose of description, and shall not be understood as an indication or implication of relative importance or implicit indication of a quantity of indicated technical features. Therefore, a characteristic limited by "first" or "second" may explicitly or implicitly indicate that one or more characteristics are included. In the descriptions of this application, unless otherwise stated, "a plurality of" means two or more than two.

In addition, in this specification, position terms such as "top", "bottom", and the like are defined relative to positions of structures in the accompanying drawings. It should be understood that these position terms are relative concepts used for relative description and clarification, and may correspondingly change based on changes in the positions of the structures.

This application provides an inverter apparatus used in a motor controller. The inverter apparatus includes a capacitor module, a power module, and a first heat sink. The power module is electrically connected to the capacitor module, a direct current is transmitted to the power module through the capacitor module, the power module is configured to convert the direct current into an alternating current, and the alternating current is used to drive a motor to run. The power module and the first heat sink are disposed in a stacked manner on the capacitor module, so that each of the power module and the first heat sink and the capacitor module are disposed in a stacked manner, and the power module and the first heat sink are also disposed in a stacked manner. The power module includes a plurality of power transistors, and the plurality of power transistors are arranged in a flat manner in a direction perpendicular to a direction in which the power module and the first heat sink are stacked. The first heat sink is configured to dissipate heat for the power transistors in the power module, so that the power transistors operate in a proper temperature environment. The inverter apparatus provided in this application has a compact structure layout and high integration. This is conducive to implementing a miniaturization embodiment of the motor controller, and reducing difficulty of disassembling and assembling internal parts of the motor controller and costs.

The inverter apparatus provided in this application can be used in the motor controller, and the motor controller including the inverter apparatus in this application can be used in a power assembly of a vehicle.

Figure 1:
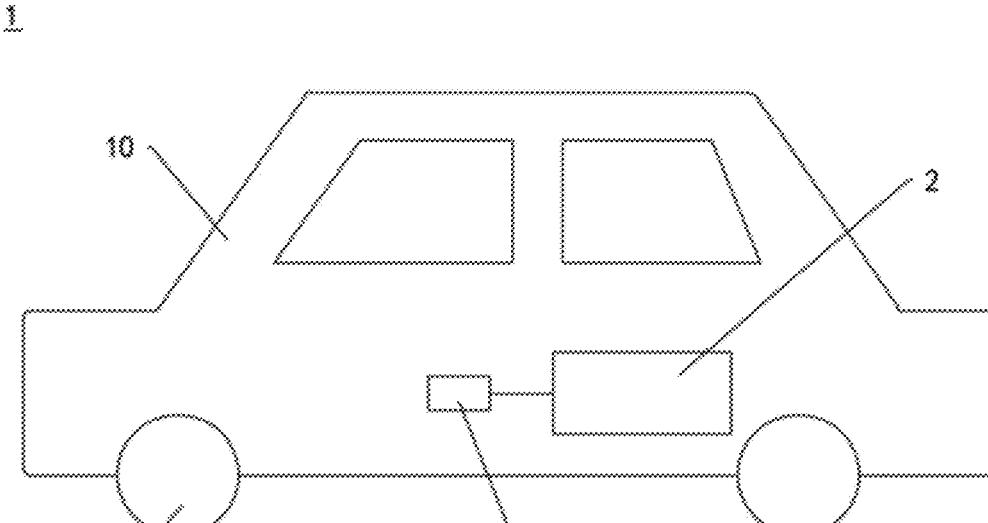
FIG. 1 is a schematic diagram of a structure of a vehicle according to an embodiment of this application.

Refer to FIG. 1. FIG. 1 is a schematic diagram of a structure of a vehicle 1 provided in an embodiment of this application. In an embodiment, the vehicle 1 includes a vehicle body 10, wheels 11, and a power assembly 2. The power assembly 2 is disposed on the vehicle body 10, and is configured to: supply power to a vehicle-mounted load 12 and drive the wheels 11 to rotate.

In this embodiment, the vehicle 1 is a wheeled vehicle 1 that is driven or pulled by a power apparatus and that is used by a person who drives on a road or used to transport articles and perform a special engineering operation. The vehicle 1 includes an electric vehicle (EV), a pure electric vehicle (PEV) or battery electric vehicle (BEV), a hybrid electric vehicle (HEV), a range extended electric vehicle (REEV), a plug-in hybrid electric vehicle (PHEV), a new energy vehicle, or the like. In some embodiments, the vehicle 1 includes a passenger vehicle and various special operation vehicles with specific functions, for example, an engineering rescue vehicle, a sprinkler, a suction sewage truck, a cement mixer, a crane car, and a medical vehicle. Alternatively, the vehicle 1 may be a robot that can drive. There may be three or more wheels 11 of the vehicle 1. This is not limited in this application.

Figure 2:
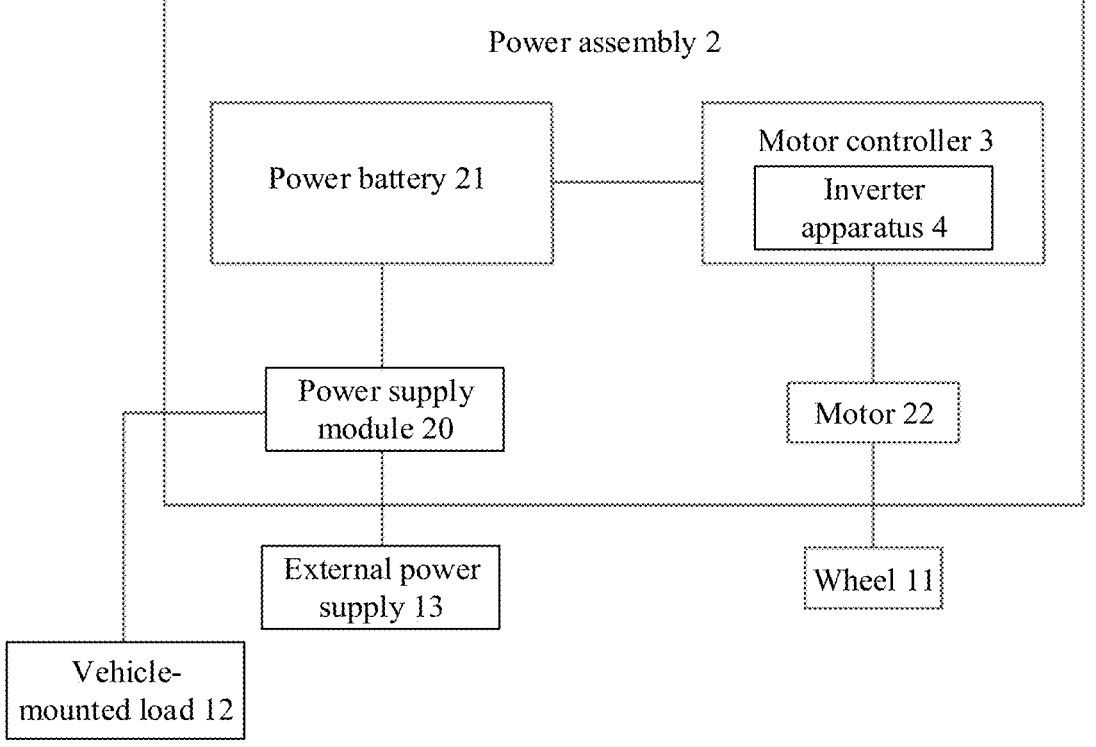
FIG. 2 is a schematic diagram of an application scenario of a power assembly according to an embodiment of this application.

Refer to FIG. 2. FIG. 2 is a schematic diagram of a power assembly 2 provided in an embodiment of this application.

In an embodiment, the power assembly 2 includes a power supply module 20, a power battery 21, a motor controller 3, and a motor 22.

In this embodiment, the power supply module 20 receives power supplied by an external power supply 13 and charges the power battery 21. The external power supply 13 may be an alternating current power grid, an alternating current charging pile, or a direct current charging pile. The power battery 21 supplies power to the motor 22 by using the motor controller 3. The motor controller 3 is electrically connected to the motor 22. The motor controller 3 is configured to convert a direct current provided by the power battery 21 into an alternating current. The motor 22 receives the alternating current and converts the alternating current into kinetic energy, to provide power for the wheels 11 and drive the wheels 11 to move.

The motor controller 3 includes an inverter apparatus 4. The inverter apparatus 4 is electrically connected to the power battery 21 and the motor 22. The inverter apparatus 4 is configured to: receive the direct current output by the power battery 21 and convert the received direct current into the alternating current.

In an embodiment, the power supply module 20 is electrically connected to the vehicle-mounted load 12, and the power supply module 20 is configured to supply power to the vehicle-mounted load 12. The power supply module 20 may be a power distribution unit or a car charger, and the vehicle-mounted load 12 includes at least one of a compressor, a battery heating module, a seat heating module, and a direct-current low-voltage power supply.

Because the new energy industry has an increasingly high requirement on power density of the motor 22, the motor controller 3 electrically connected to the motor 22 is also required to output a higher alternating current, so that the motor controller 3 works in a high temperature environment. As a result, the motor controller 3 needs a large quantity of parts to simultaneously implement functions of power conversion and cooling and heat dissipation of the motor controller 3. Consequently, the motor controller 3 has a large size. This is not conducive to an entire vehicle layout. In a reprocessing or maintenance process, parts inside the motor controller 3 need to be disassembled one by one, and disassembly and assembly operations are complex.

In the motor controller 3 and the inverter apparatus 4 provided in this application, a miniaturization embodiment of the motor controller 3 is implemented through optimization of structures of the power module and the heat sink, so as to improve integration of the motor controller 3 and reduce difficulty of disassembling and assembling the motor controller 3 and costs.

The following describes in detail the inverter apparatus 4 provided in an embodiment of this application.

Figure 3:
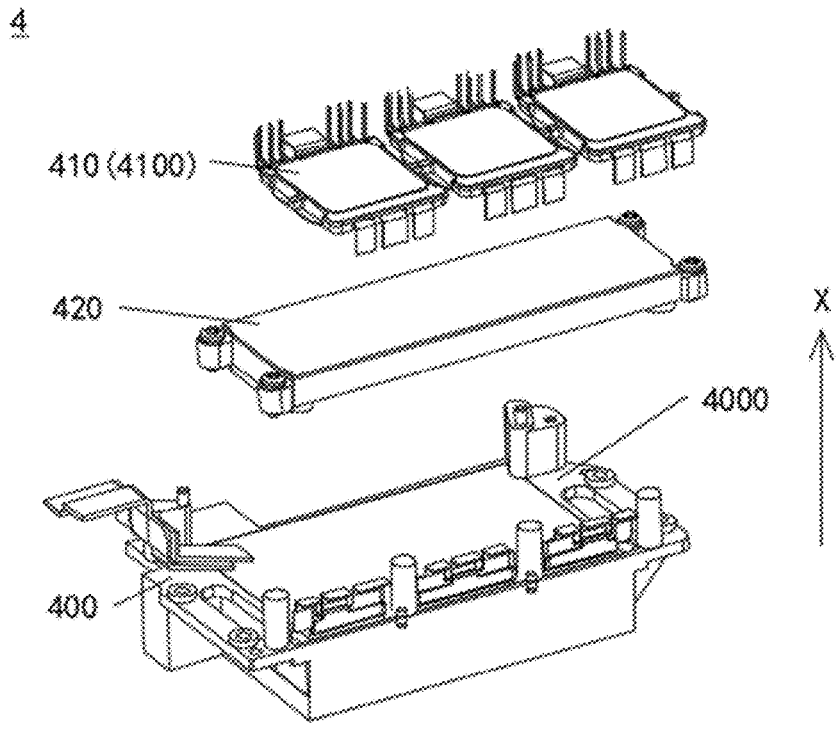
FIG. 3 is an exploded view of an inverter apparatus according to an embodiment of this application.
Figure 4:
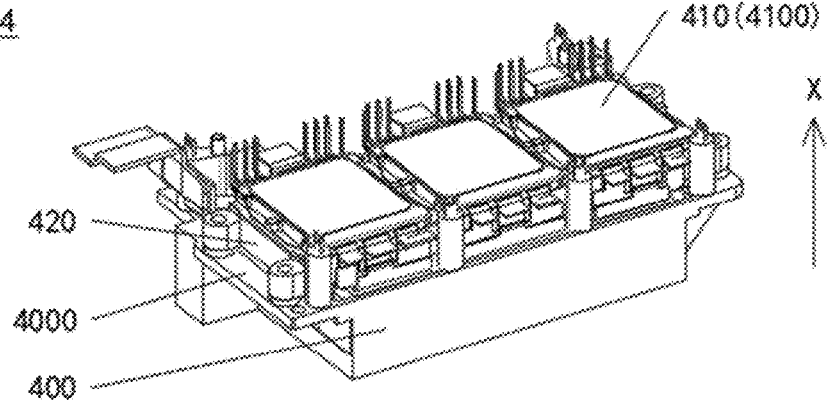
FIG. 4 is a schematic diagram of a structure of an inverter apparatus according to an embodiment of this application.
Figure 5:
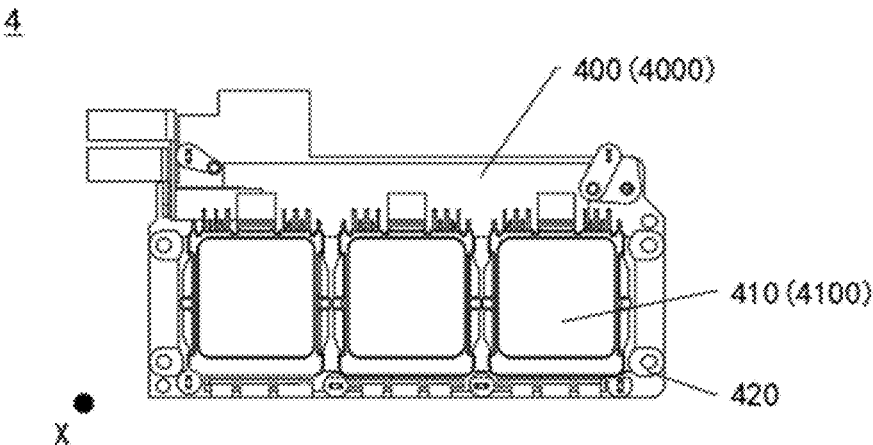
FIG. 5 is a schematic diagram of a structure of an inverter apparatus according to an embodiment of this application.

Refer to FIG. 3 to FIG. 5. FIG. 3 is an exploded diagram of an inverter apparatus 4 provided in an embodiment of this application. FIG. 4 is a schematic diagram of a structure of an inverter apparatus 4 provided in an embodiment of this application. FIG. 5 is a schematic diagram of a structure of an inverter apparatus 4 provided in an embodiment of this application. In an embodiment, the inverter apparatus 4 includes a capacitor module 400, a power module 410, and a first heat sink 420 (as shown in FIG. 3).

In this embodiment of this application, the capacitor module 400 is configured to: transmit the direct current and adjust the direct current, including but not limited to smooth a voltage, so that the voltage is still smooth when a switching device in the power module 410 is switched on or off. The capacitor module 400 may further reduce an inductance parameter, weaken a peak voltage, absorb a high pulse current of the inverter apparatus 4, and prevent overcharge of the voltage and impact of a transient voltage on the inverter apparatus 4.

In this embodiment of this application, the power module 410 implements an alternating current-direct current conversion function. The power module 410 and the first heat sink 420 are disposed in a stacked manner on the capacitor module 400 (as shown in FIG. 4).

In an embodiment, the power module 410 of the inverter apparatus 4 includes a plurality of power transistors 4100. The plurality of power transistors 4100 in the power module 410 are configured to form a three-phase bridge arm circuit. The plurality of power transistors 4100 in the power module 410 are arranged in a flat manner in a direction perpendicular to a direction in which the power module 410 and the first heat sink 420 are stacked. For example, the power module 410 includes six power transistors 4100, and every two power transistors 4100 form a one-phase bridge arm circuit. Two terminals of each phase bridge arm circuit are electrically connected to the capacitor module 400. In an embodiment, the six power transistors 4100 are divided into two rows and arranged in a flat manner in the direction perpendicular to the direction in which the power module 410 and the first heat sink 420 are stacked. In an embodiment, the six power transistors 4100 are arranged in a single row in a flat manner in the direction perpendicular to the direction in which the power module 410 and the first heat sink 420 are stacked.

In an embodiment, the inverter apparatus 4 includes a plurality of power modules 410. The plurality of power modules 410 are configured to form a three-phase bridge arm circuit. The plurality of power modules 410 are arranged in a flat manner in the direction perpendicular to the direction in which the power modules 410 and the first heat sink 420 are stacked. For example, the inverter apparatus 4 includes three power modules 410. Each power module 410 forms a one-phase bridge arm circuit. Each power module 410 includes two power transistors 4100, and the two power transistors 4100 form a one-phase bridge arm circuit. Two terminals of each phase bridge arm circuit are electrically connected to the capacitor module 400. As shown in FIG. 3 and FIG. 5, the plurality of power modules 410 are sequentially arranged adjacently in a flat manner in the direction perpendicular to the direction in which the power modules 410 and the first heat sink 420 are stacked.

In this embodiment of this application, the power transistor 4100 includes at least one of an insulated gate bipolar transistor (IGBT), a silicon carbide power transistor, a silicon-based transistor, and a metal-oxide-semiconductor field-effect transistor (MOSFET).

In this embodiment, the direction in which the power module 410 and the first heat sink 420 are stacked is a first direction X, and the power module 410 and the first heat sink 420 are disposed in a stacked manner in the first direction X. The plurality of power transistors 4100 are arranged in a flat manner in a direction perpendicular to the first direction X. That is, the plurality of power transistors 4100 are arranged in a flat manner in a plane perpendicular to the first direction X. In an embodiment, the plane perpendicular to the first direction X may be a surface that is of the first heat sink 420 and that faces the power module 410 in the first direction X. Compared with a manner in which the plurality of power transistors 4100 are disposed in a stacked manner in the first direction X, this solution is conducive to reducing a length of the inverter apparatus 4 in the first direction X, and effectively utilizing a mounting area of the first heat sink 420, so as to implement a miniaturization embodiment of the motor controller 3.

It should be noted that the perpendicularity defined in this embodiment of this application is not limited to an absolutely perpendicular and intersecting relationship (where the included angle is 90 degrees). A non-absolute perpendicular and intersecting relationship caused by factors such as an assembly tolerance, a design tolerance, and a structural flatness is allowed, and an error within a small angle range, for example, an assembly error within a range of 80 degrees to 100 degrees is allowed, and this may be understood as a perpendicular relationship.

In this embodiment, the power module 410 is electrically connected to the capacitor module 400, and the power module 410 is configured to convert the direct current into the alternating current. The capacitor module 400 is electrically connected to an input terminal of the power module 410. The direct current is transmitted to the power module 410 through the capacitor module 400 and then converted into the alternating current. An output terminal of the power module 410 is electrically connected to an input terminal of the motor. The power module 410 transmits the alternating current to the motor, and drives the motor to run.

In this embodiment, the first heat sink 420 is configured to dissipate heat for the power module 410. The first heat sink 420 and the power module 410 are disposed in a stacked manner (as shown in FIG. 4). When cooling liquid flows into the first heat sink 420, the cooling liquid can exchange heat with the power module 410, and the first heat sink 420 takes the heat away from the power module 410, so as to reduce a temperature of the inverter apparatus 4 in a stable working state, thereby implementing temperature control on the motor controller 3.

In this application, the inverter apparatus 4 has a compact structure layout. The inverter apparatus 4 is used in the motor controller 3. This improves integration of the motor controller 3, and is conducive to implementing a miniaturization embodiment of the motor controller 3 and optimizing an entire vehicle layout. Compared with a manner in which the capacitor module 400, the power module 410, and the first heat sink 420 are arranged in a flat manner side by side, in this embodiment of this application, the power module 410 and the first heat sink 420 are disposed in a stacked manner on a side of the capacitor module 400, and the power transistors 4100 are arranged in a flat manner in the plane perpendicular to the first direction X, so that a size of the motor controller 3 can be reduced. In addition, the capacitor module 400, the power module 410, and the first heat sink 420 are pre-assembled into the inverter apparatus 4, so that parts inside the motor controller 3 are modularized. When the motor controller 3 needs to be reprocessed or maintained, the parts do not need to be disassembled and assembled one by one, so that the motor controller 3 can be quickly assembled and disassembled, thereby reducing operation difficulty and costs.

Still refer to FIG. 3. In an embodiment, the first heat sink 420 is disposed in a stacked manner on the capacitor module 400, the power module 410 is disposed in a stacked manner on a side that is of the first heat sink 420 and that is away from the capacitor module 400, and the plurality of power transistors 4100 are arranged in a flat manner on the first heat sink 420.

In this embodiment, the capacitor module 400, the first heat sink 420, and the power module 410 are sequentially disposed in a stacked manner in the first direction X, and the first heat sink 420 is located between the power module 410 and the capacitor module 400, so that the cooling liquid in the first heat sink 420 can simultaneously perform heat exchange with the power transistors 4100 in the power module 410 and the capacitor module 400. This is conducive to improving utilization of the cooling liquid and optimizing cooling efficiency of the first heat sink 420. In some embodiments, the power module 410 may alternatively be disposed between the first heat sink 420 and the capacitor module 400. In this case, the first heat sink 420 can perform cooling and heat dissipation on the power module 410 and a component such as a circuit board that is located above the first heat sink 420.

In an embodiment, the capacitor module 400 includes a mounting surface 4000, and the mounting surface 4000 is used for mounting a component. The mounting surface 4000 of the capacitor module 400 is one of the largest surfaces of the capacitor module 400, and orthographic projections of the power module 410 and the first heat sink 420 on the mounting surface 4000 are located in the mounting surface 4000 (as shown in FIG. 5). This is conducive to reducing a size occupied by the inverter apparatus 4.

Figure 6:
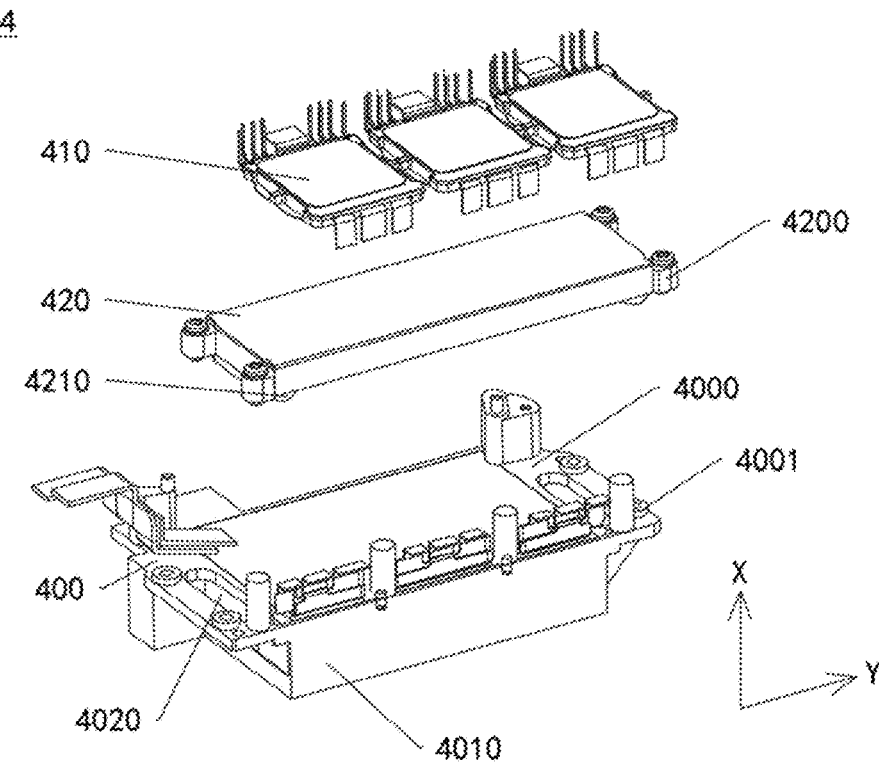
FIG. 6 is an exploded view of an inverter apparatus according to an embodiment of this application.
Figure 7:
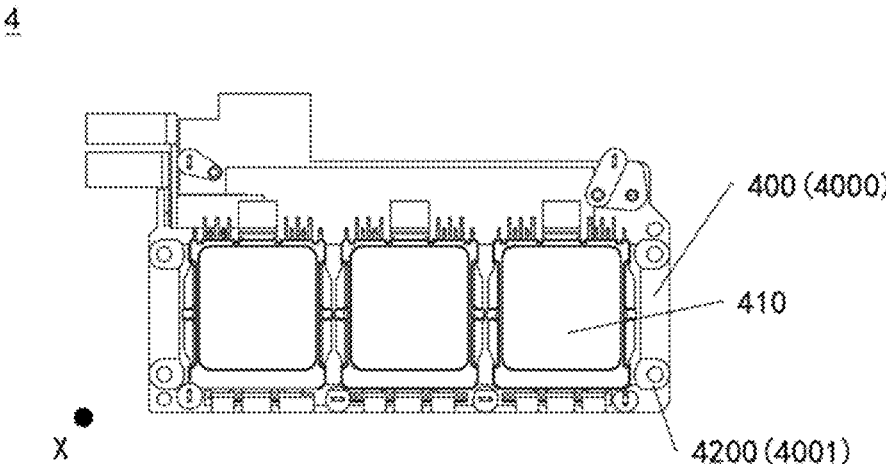
FIG. 7 is a schematic diagram of a structure of an inverter apparatus according to an embodiment of this application.

Refer to FIG. 6 and FIG. 7. FIG. 6 is an exploded diagram of an inverter apparatus 4 provided in an embodiment of this application. FIG. 7 is a schematic diagram of a structure of an inverter apparatus 4 provided in an embodiment of this application. In an embodiment, a first fastener 4001 (as shown in FIG. 6) is disposed on an edge of the mounting surface 4000, a second fastener 4200 (as shown in FIG. 6) is disposed on an edge of the first heat sink 420, and the first fastener 4001 and the second fastener 4200 are fastened in a cooperative manner (as shown in FIG. 7), so that the first heat sink 420 is fastened to the capacitor module 400.

In this embodiment, the first fastener 4001 and the second fastener 4200 are fastened in a cooperative manner in the first direction X. A fastening manner of the first fastener 4001 and the second fastener 4200 is not limited. For example, the fastening manner may be connection by using a screw, a clip, or a weld assembly. In an embodiment, the second fastener 4200 may be a positioning hole, an inner wall of the positioning hole has no thread, and the first fastener 4001 is a screw hole. A screw runs through the screw hole and the positioning hole and is connected, in a threaded manner, to a component located below the capacitor module 400. For example, the screw runs through the screw hole and the positioning hole and is fastened to a fastener in a motor controller housing 300 in a threaded connection manner. In this case, the positioning hole is used for positioning. In some embodiments, threads may be disposed in the positioning hole, so that the first fastener 4001 is connected to the positioning hole in a threaded manner.

In this embodiment, the capacitor module 400 includes a capacitor housing 4010, and the mounting surface 4000 is located on the capacitor housing 4010. Projections of the first fastener 4001 and the second fastener 4200 in the first direction X overlap (as shown in FIG. 7). First fasteners 4001 are located on two side edges of the mounting surface 4000 in a second direction Y, and second fasteners 4200 are located on two side edges of the first heat sink 420 in the second direction Y. The second direction Y is parallel to the mounting surface 4000.

In this solution, the first fastener 4001 and the second fastener 4200 are disposed in the capacitor module 400 and the first heat sink 420 respectively, so that the capacitor module 400 is fastened to the first heat sink 420. This is conducive to improving overall structural stability of the inverter apparatus 4. When an external environment exerts an external force on the inverter apparatus 4, a fixed connection relationship between the first fastener 4001 and the second fastener 4200 alleviates impact caused by the external environment on the inverter apparatus 4.

Still refer to FIG. 6. In an embodiment, first heat sink avoidance holes 4020 are provided in two sides of the mounting surface 4000 in the second direction Y. First heat sink interfaces 4210 are disposed on a side that is of the first heat sink 420 and that is close to the mounting surface 4000 in the first direction X. The first heat sink interfaces 4210 protrude toward the mounting surface 4000 in the first direction X and are disposed in correspondence with the first heat sink avoidance holes 4020 in the first direction X. The first heat sink interfaces 4210 are configured to communicate with a waterway in the motor controller housing, so that cooling liquid in the motor controller housing can flow in the first heat sink 420. In this solution, the first heat sink avoidance hole 4020 and the first heat sink interface 4210 are provided. This is conducive to auxiliary positioning when the first heat sink 420 and the capacitor module 400 are fastened, and enhancing reliability of a fixed connection.

Figure 8:
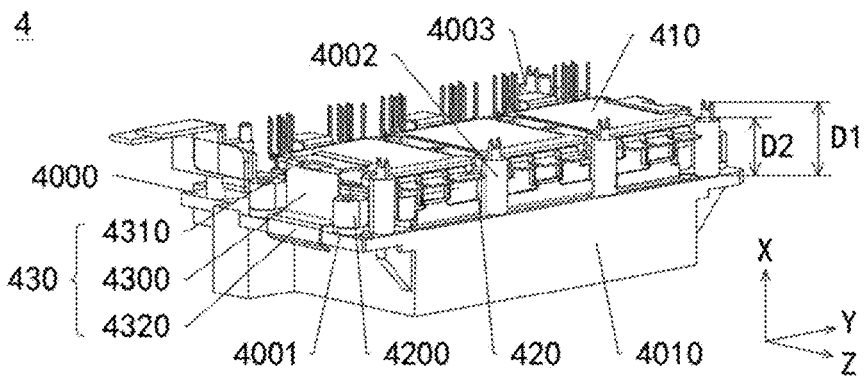
FIG. 8 is a schematic diagram of a structure of an inverter apparatus according to an embodiment of this application.

Refer to FIG. 8. FIG. 8 is a schematic diagram of a structure of an inverter apparatus 4 provided in an embodiment of this application. In an embodiment, the inverter apparatus 4 further includes a sheet metal clip 430. Two ends of the sheet metal clip 430 are respectively clamped and fastened to the power module 410 and the capacitor module 400, so as to fasten the power module 410, the first heat sink 420, and the capacitor module 400 in the direction in which the power module 410 and the first heat sink 420 are stacked.

In this embodiment, because the first heat sink 420 is located between the power module 410 and the capacitor module 400 in the first direction X, the sheet metal clip 430 is disposed in the inverter apparatus 4, and this is conducive to reinforcing a connection relationship between the capacitor module 400 and the first heat sink 420. The capacitor module 400, the first heat sink 420, and the power module 410 are fastened through the sheet metal clip 430. This is conducive to improving overall structural stability of the inverter apparatus 4. When an external environment exerts an external force on the inverter apparatus 4, the sheet metal clip 430 is disposed to alleviate impact caused by the external environment on the inverter apparatus 4. In this embodiment, a clip made of a sheet metal material is used, so that fastening strength is greater, and fastening strength of the capacitor module 400, the first heat sink 420, and the power module 410 is improved.

In an embodiment, two first fasteners 4001 are disposed on one side edge of the mounting surface 4000 in the second direction Y, and the sheet metal clip 430 is located between the two first fasteners 4001 in a third direction Z. In this embodiment, the sheet metal clip 430, the first fasteners 4001, and the second fasteners 4200 are disposed on a same side of the mounting surface 4000. The third direction Z is parallel to the mounting surface 4000 and is perpendicular to the second direction Y. In this solution, a layout between different devices and structures is compact. This is conducive to reducing a size of the inverter apparatus 4.

In an embodiment, the sheet metal clip 430 includes a clip body 4300, and a first protruding part 4310 and a second protruding part 4320 that are located on two ends of the clip body 4300. The clip body 4300 extends in the first direction X, and the first protruding part 4310 is clamped and fastened to a side that is of the power module 410 and that is away from the capacitor module 400 in the first direction X. The second protruding part 4320 is in a "C" shape, and the second protruding part 4320 is clamped and fastened to an edge of the capacitor housing 4010. The first protruding part 4310 and the second protruding part 4320 exert acting forces to the power module 410 and the capacitor module 400 respectively. This is conducive to reinforcing a connection relationship between the first fastener 4001 of the capacitor module 400 and the second fastener 4200 of the first heat sink 420.

Figure 9:
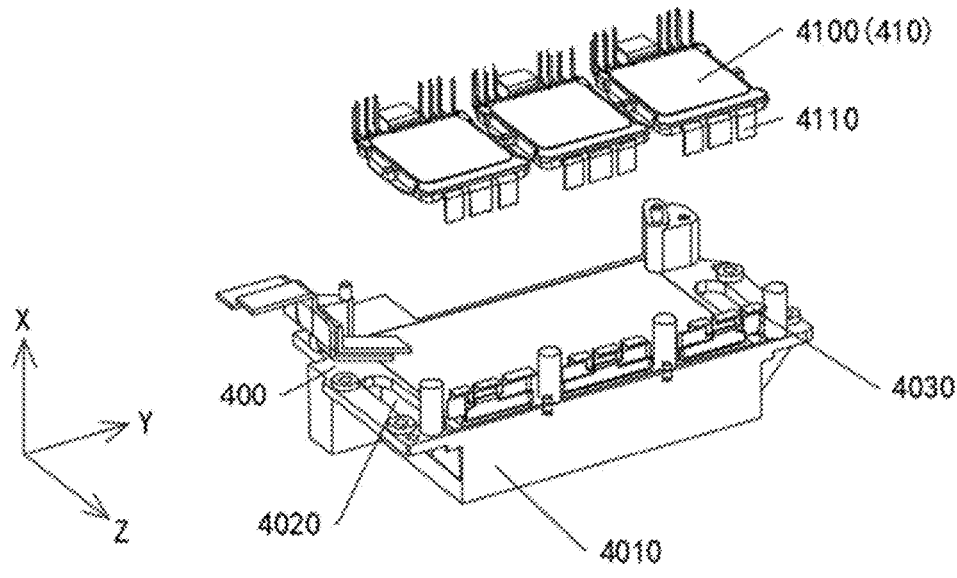
FIG. 9 is a schematic diagram of structures of a capacitor module and a power module according to an embodiment of this application.

Refer to FIG. 9. FIG. 9 is a schematic diagram of structures of a capacitor module 400 and a power module 410 provided in an embodiment of this application. In an embodiment, the inverter apparatus 4 includes a plurality of groups of first power terminals 4110. Each group of the first power terminals 4110 includes at least one first power terminal 4110, and each of the first power terminal 4110 is configured to connect to one of the power transistor 4100 and the capacitor module 400. The plurality of first power terminals 4110 are sequentially arranged along a side of the first heat sink 420.

In this embodiment, the power transistor 4100 is electrically connected to the capacitor module 400 through the first power terminal 4110, and the direct current is transmitted from the capacitor module 400 to the power transistor 4100 through the first power terminal 4110. The plurality of first power terminals 4110 are arranged in the second direction Y, and a side of the first heat sink 420 in the second direction Y is a long side of the first heat sink 420. In this solution, the plurality of first power terminals 4110 are sequentially arranged along the long side of the first heat sink 420. This is conducive to improving space utilization of the inverter apparatus 4.

In this embodiment, there are three groups of first power terminals 4110, and each group of the first power terminals 4110 includes three first power terminals 4110. In some other embodiments, a quantity of first power terminals 4110 in each group of the first power terminals 4110 may be another positive integer, and a person skilled in the art may adjust the quantity based on an actual requirement. This is not limited in this application.

Figure 10:
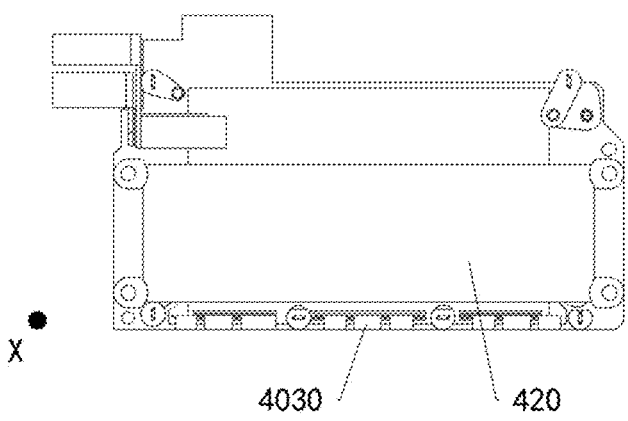
FIG. 10 is a schematic diagram of structures of a capacitor module and a first heat sink according to an embodiment of this application.

Refer to FIG. 9 and FIG. 10. FIG. 10 is a schematic diagram of structures of a capacitor module 400 and a first heat sink 420 provided in an embodiment of this application. In an embodiment, the capacitor module 400 further includes a plurality of capacitor connection terminals 4030 (as shown in FIG. 9), and each of the capacitor connection terminals 4030 is configured to connect to one of the power transistor 4100 (as shown in FIG. 9). The plurality of capacitor connection terminals 4030 are arranged on an upper surface of the capacitor module 400 along the first heat sink 420 (as shown in FIG. 9). Orthographic projections of the capacitor connection terminals 4030 and the first heat sink 420 on the upper surface of the capacitor module 400 do not overlap (as shown in FIG. 10). The upper surface of the capacitor module 400 is a surface that is of the capacitor module 400 and that faces the first heat sink 420.

In this embodiment, the first power terminal 4110 is electrically connected to the capacitor connection terminal 4030. The power transistor 4100 is electrically connected to the capacitor module 400 through the first power terminal 4110 and the capacitor connection terminal 4030, and the direct current is transmitted from the capacitor module 400 to the power transistor 4100 through the capacitor connection terminal 4030 and the first power terminal 4110.

In this embodiment, the upper surface of the capacitor module 400 may also be referred to as the mounting surface 4000 of the capacitor module 400. The capacitor connection terminal 4030 is located on the mounting surface 4000 and extends in the first direction X (as shown in FIG. 9), and orthographic projections of the capacitor connection terminal 4030 and the first heat sink 420 on the mounting surface 4000 do not overlap (as shown in FIG. 10). The first power terminal 4110 protrudes from the power transistor 4100 to the capacitor module 400 (as shown in FIG. 9).

In this embodiment, the capacitor connection terminal 4030 and the first power terminal 4110 are vertically and correspondingly disposed in the first direction X. The capacitor connection terminal 4030 is located on one side edge of the mounting surface 4000 in the third direction Z, and the first power terminal 4110 is located on a side of the power module 410 in the third direction Z. Because the first heat sink 420 is located between the capacitor module 400 and the power module 410 in the first direction X, the following setting is performed: Projections of the capacitor connection terminals 4030 and the first heat sink 420 in the first direction X do not overlap, so that the capacitor module 400 is not blocked by the first heat sink 420 in a process of being electrically connected to the power module 410, and the size of the inverter apparatus 4 may not be increased additionally, so that the inverter apparatus 4 is more miniaturized.

In an embodiment, when the capacitor connection terminal 4030 and the first power terminal 4110 are vertically disposed, the capacitor connection terminal 4030 and the first power terminal 4110 may be welded through a laser on side edges of the capacitor module 400 and the first heat sink 420, so that the capacitor connection terminal 4030 and the first power terminal 4110 are fastened.

In an embodiment, the first power terminal 4110 and the capacitor connection terminal 4030 may be horizontal. This is determined based on design space and a mounting process requirement. In this embodiment, the first power terminal 4110 and the capacitor connection terminal 4030 may be fastened through a screw. For example, both the first power terminal 4110 and the capacitor connection terminal 4030 horizontally extend for a length, and then are fastened through a screw.

Figure 11:
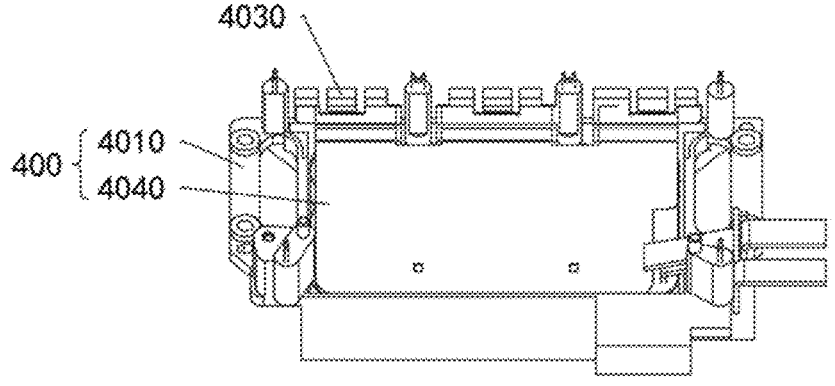
FIG. 11 is a schematic diagram of a structure of a capacitor module according to an embodiment of this application.

Refer to FIG. 11. FIG. 11 is a schematic diagram of a structure of a capacitor module 400 provided in an embodiment of this application. In an embodiment, the capacitor module 400 further includes a capacitor housing 4010 and a capacitor body 4040 located inside the capacitor housing 4010. One end of the capacitor connection terminal 4030 is located in the capacitor housing 4010 and is electrically connected to the capacitor body 4040.

In this embodiment, the capacitor body 4040 plays a role of filtering the direct current, and the capacitor body 4040 is electrically connected to the capacitor connection terminal 4030. The direct current that has been filtered is transmitted to the power transistor 4100 through the capacitor connection terminal 4030 and the first power terminal 4110, and the power transistor 4100 implements a direct current-alternating current conversion function.

Figure 12:
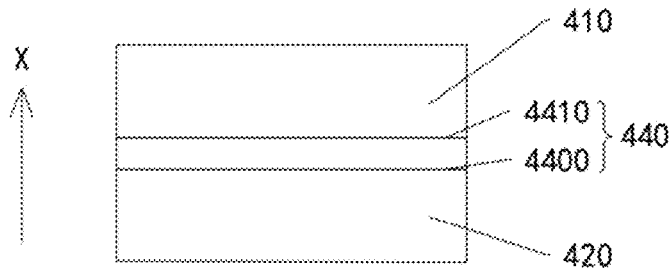
FIG. 12 is a schematic diagram of a partial structure of an inverter apparatus according to an embodiment of this application.

Refer to FIG. 12. FIG. 12 is a schematic diagram of a partial structure of an inverter apparatus 4 provided in an embodiment of this application. In an embodiment, a metal connection layer 440 is disposed between the first heat sink 420 and the power module 410. The metal connection layer 440 is fastened to both the first heat sink 420 and the power module 410. Two surfaces that are of the metal connection layer 440 and that are disposed opposite to each other in the direction in which the power module 410 and the first heat sink 420 are stacked are in contact with the first heat sink 420 and the power module 410 respectively.

In this embodiment, two surfaces that are of the metal connection layer 440 and that are opposite to each other in the first direction X are a first heat sink connection surface 4400 and a power module connection surface 4410 respectively. The first heat sink 420 is in contact with and fastened to the first heat sink connection surface 4400 of the metal connection layer 440, and the power module 410 is in contact with and fastened to the power module connection surface 4410 of the metal connection layer 440, so that the first heat sink 420 is also fastened to the power module 410, and the first heat sink 420 is simultaneously fastened to the capacitor module 400 through the first fastener 4001 and the second fastener 4200. Therefore, overall structural stability of the inverter apparatus 4 is ensured.

In this embodiment, heat generated by the power module 410 is transferred to the cooling liquid in the first heat sink 420 through the metal connection layer 440. The metal connection layer 440 between the power module 410 and the first heat sink 420 is made of a high heat conduction material, including but not limited to copper, aluminum, or an alloy of copper and aluminum. Compared with use of a conventional TIM or solder, the metal connection layer 440 in this solution is more conducive to reducing thermal resistance of a heat dissipation path in the inverter apparatus 4, and improving cooling efficiency of the first heat sink 420.

In an embodiment, the metal connection layer 440 may be formed by welding solder or by sintering.

Figure 13:
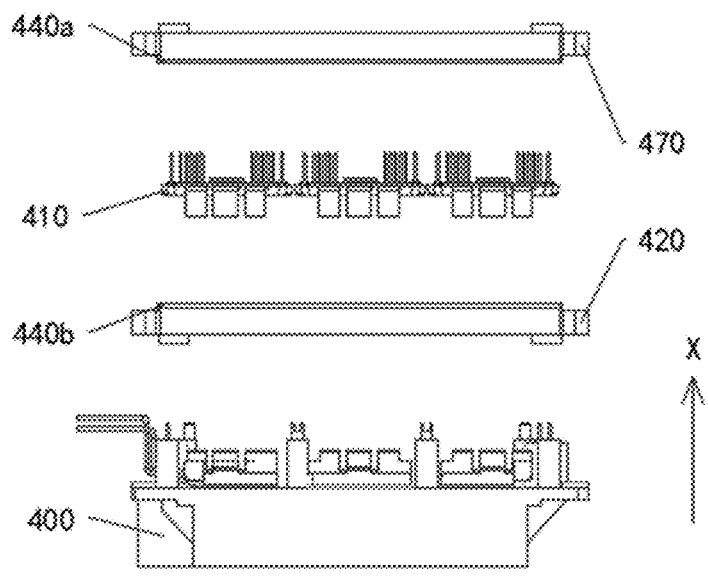
FIG. 13 is an exploded view of an inverter apparatus according to an embodiment of this application.

Refer to FIG. 13. FIG. 13 is an exploded view of an inverter apparatus 4 provided in an embodiment of this application. In an embodiment, the inverter apparatus 4 includes a second heat sink 470, and the second heat sink 470 is disposed in a stacked manner on a side that is of the power module 410 and that is away from the first heat sink 420.

In this embodiment, the power module 410 is located between the second heat sink 470 and the first heat sink 420 in the first direction X. The second heat sink 470 is located on a side that is of the power module 410 and that is away from the capacitor module 400 in the first direction X, and the first heat sink 420 is located on a side that is of the power module 410 and that is close to the capacitor module 400 in the first direction X. The second heat sink 470 and the first heat sink 420 form double-sided heat dissipation for the power module 410. The cooling liquid in the second heat sink 470 and the first heat sink 420 exchanges heat with the power module 410 in opposite directions. A contact area between the cooling liquid and the power module 410 is large. This is conducive to improving cooling efficiency of the first heat sink 420. In an embodiment, a heating device is disposed on a side that is of the second heat sink 470 and that is away from the power module 410 in the first direction X, and the second heat sink 470 simultaneously performs cooling and heat dissipation on the heating device and the power module 410.

In an embodiment, a first metal connection layer 440a is disposed between the power module 410 and the second heat sink 470, and the power module 410 is fastened to the second heat sink 470 through the first metal connection layer 440a. A second metal connection layer 440b is disposed between the power module 410 and the first heat sink 420, and the power module 410 is fastened to the first heat sink 420 through the second metal connection layer 440b. The first metal connection layer 440a and the second metal connection layer 440b are made of a high heat conduction material, including but not limited to copper, aluminum, or an alloy of copper and aluminum. Compared with use of a conventional TIM or solder, the first metal connection layer 440a and the second metal connection layer 440b in this solution are more conducive to reducing thermal resistance of a heat dissipation path in the inverter apparatus 4 and improving cooling efficiency of the first heat sink 420.

In an embodiment, the second heat sink 470 and the power module 410 may be bonded and fastened through a thermally conductive adhesive. A mounting process of bonding and fastening by using the thermally conductive adhesive is simpler and safer.

Figure 14:
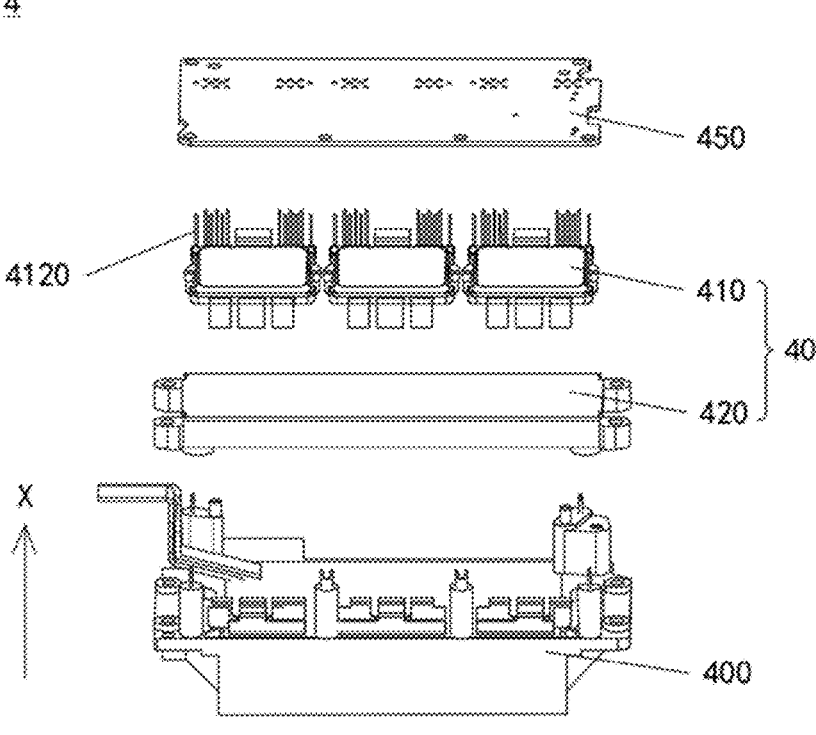
FIG. 14 is an exploded view of an inverter apparatus according to an embodiment of this application.
Figure 15:
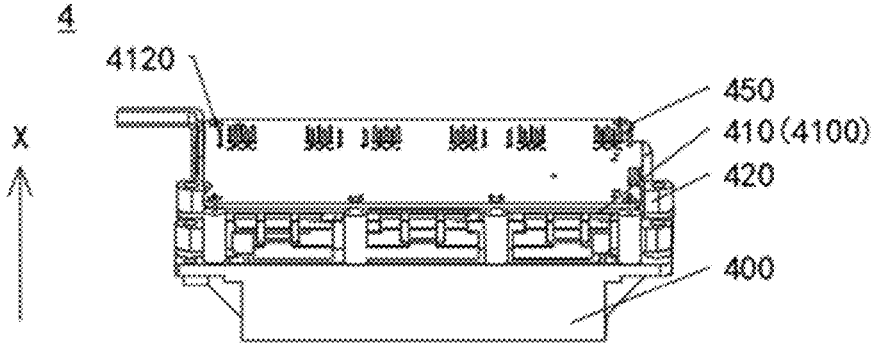
FIG. 15 is a schematic diagram of a structure of an inverter apparatus according to an embodiment of this application.

Refer to FIG. 14 and FIG. 15. FIG. 14 is an exploded diagram of an inverter apparatus 4 provided in an embodiment of this application. FIG. 15 is a schematic diagram of a structure of an inverter apparatus 4 provided in an embodiment of this application. In an embodiment, the inverter apparatus 4 includes a first circuit board 450 (as shown in FIG. 14), the power module 410 and the first heat sink 420 are disposed in a stacked manner between the capacitor module 400 and the first circuit board 450 (as shown in FIG. 14), and the first circuit board 450 is electrically connected to the plurality of power transistors 4100 (as shown in FIG. 15).

In this embodiment, the first circuit board 450 is configured to control the power transistor 4100 to convert the direct current into the alternating current. The capacitor module 400, the first heat sink 420, the power module 410, and the first circuit board 450 are disposed in a stacked manner in the first direction X. The inverter apparatus 4 is compact in an overall layout, and occupies a small size in another direction. This is conducive to implementing a miniaturization embodiment of the inverter apparatus 4. In addition, the first circuit board 450 is integrated into the inverter apparatus 4, so as to improve a modularization degree of internal devices of the motor controller 3. This is conducive to reducing difficulty of disassembling and assembling the motor controller 3 and costs.

In an embodiment, the power module 410 and the first heat sink 420 form a heat dissipation power module 40 (as shown in FIG. 14), and the first circuit board 450 is located on a side that is of the heat dissipation power module 40 and that is away from the capacitor module 400 (as shown in FIG. 14).

In an embodiment, the power module 410 further includes a signal terminal 4120 (as shown in FIG. 15). The signal terminal 4120 is located on a side that is of the power module 410 and that is opposite to the first power terminal 4110, and extends to the first circuit board 450. The signal terminal 4120 is a pin, and the signal terminal 4120 is inserted into the first circuit board 450 to implement an electrical connection between the power module 410 and the first circuit board 450. The first circuit board 450 sends a control signal to the power module 410 by using the signal terminal 4120, so that the power module 410 implements an alternating current-direct current conversion function.

Figure 16:
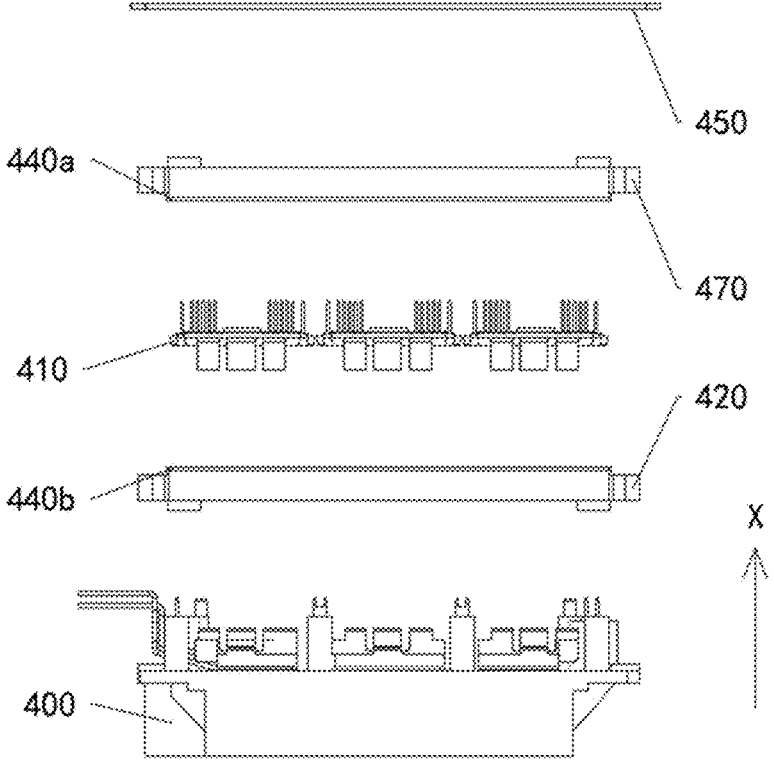
FIG. 16 is an exploded view of an inverter apparatus according to an embodiment of this application.

Refer to FIG. 16. FIG. 16 is an exploded view of an inverter apparatus 4 provided in an embodiment of this application. In an embodiment, the second heat sink 470 is located between the first circuit board 450 and the power module 410 in the first direction X. In this solution, the second heat sink 470 can simultaneously perform cooling and heat dissipation on the first circuit board 450 and the power module 410.

Figure 17:
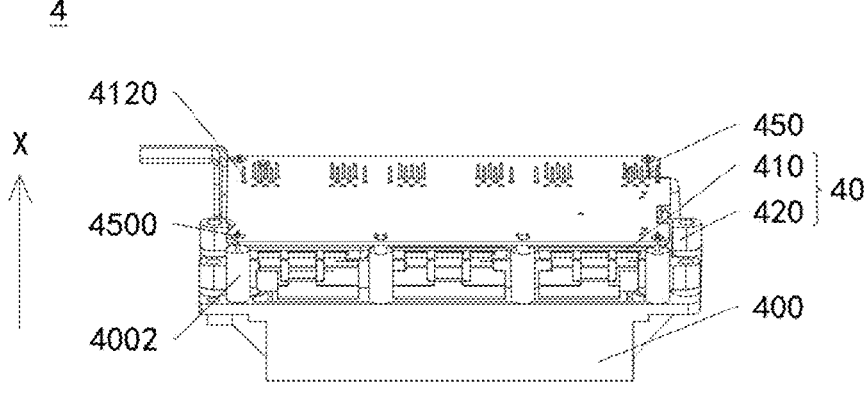
FIG. 17 is a schematic diagram of a structure of an inverter apparatus according to an embodiment of this application.
Figure 18:
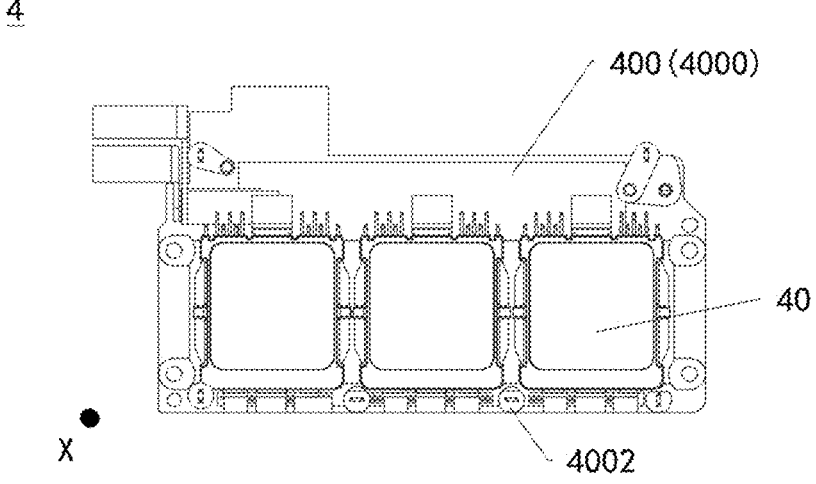
FIG. 18 is a schematic diagram of a structure of an inverter apparatus according to an embodiment of this application.

Refer to FIG. 8, FIG. 17, and FIG. 18. FIG. 17 is a schematic diagram of a structure of an inverter apparatus 4 provided in an embodiment of this application. FIG. 18 is a schematic diagram of a structure of an inverter apparatus 4 provided in an embodiment of this application. In an embodiment, the upper surface of the capacitor module 400 includes a plurality of first support columns 4002 (as shown in FIG. 17), and the plurality of first support columns 4002 are configured to fasten the first circuit board 450 and the capacitor module 400 (as shown in FIG. 17 and FIG. 18). In this embodiment, the first support column 4002 extends in the first direction X (as shown in FIG. 17), one end of the first support column 4002 is fastened to the upper surface of the capacitor module 400 (as shown in FIG. 18), and the other end of the first support column 4002 is fastened to the first circuit board 450 (as shown in FIG. 17).

In the direction in which the power module 410 and the first heat sink 420 are stacked, a height of each of the first support columns 4002 is greater than or equal to a stacked height of the power module 410 and the first heat sink 420 (as shown in FIG. 8). The height is a length in the first direction X. In this embodiment, the height of each first support column 4002 is H1, and the stacked height of the power module 410 and the first heat sink 420 is H2. Because the first support column 4002 needs to be fastened to the first circuit board 450, H1≥H2 is set in this solution, so that mounting space can be provided for a connection between the capacitor module 400 and the first circuit board 450, thereby reducing operation difficulty.

The plurality of first support columns 4002 are sequentially arranged along a side of the first heat sink 420, and orthographic projections of the plurality of first support columns 4002 and the first heat sink 420 on the upper surface of the capacitor module 400 do not overlap. In this embodiment, because the first heat sink 420 is located between the first circuit board 450 and the capacitor module 400 in the first direction X, the following setting is performed: Projections of the first support columns 4002 and the first heat sink 420 in the first direction X do not overlap, so that the first circuit board 450 is not blocked by the first heat sink 420 in a process of fixedly connecting to the capacitor module 400.

In an embodiment, circuit board fixing holes 4500 (as shown in FIG. 17) are provided in an edge of the first circuit board 450, and the first support columns 4002 are inserted into the circuit board fixing holes 4500 in the first direction X, to implement a fixed connection between the capacitor module 400 and the edge of the first circuit board 450. The capacitor module 400 is fastened to the first circuit board 450, so that a position of the heat dissipation power module 40 between the capacitor module 400 and the first circuit board 450 is also fixed, and an overall structure of the inverter apparatus 4 is stable. When an external environment exerts an external force on the motor controller 3, the inverter apparatus 4 is not easily displaced in the motor controller 3. This is conducive to working in a stable state by the inverter apparatus 4.

Figure 19:
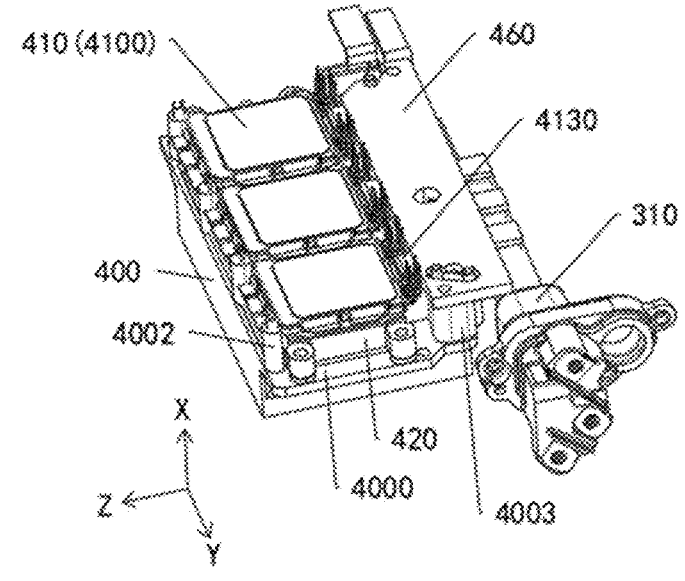
FIG. 19 is a schematic diagram of a structure of an inverter apparatus according to an embodiment of this application.

Refer to FIG. 19. FIG. 19 is a schematic diagram of a structure of an inverter apparatus 4 provided in an embodiment of this application. In an embodiment, the inverter apparatus 4 includes a second circuit board 460, and the second circuit board 460 and the power module 410 are disposed side by side between the capacitor module 400 and the first circuit board 450.

In this embodiment, the second circuit board 460 is located on a side of the power module 410 in the third direction Z, and the second circuit board 460 and the power module 410 are disposed side by side. In addition, the second circuit board 460 is located on a side that is of the first circuit board 450 and that faces the capacitor module 400, and there is no stacking relationship between the second circuit board 460 and the power module 410 in the first direction X. In this solution, the second circuit board 460 is disposed in the inverter apparatus 4, and can provide a basis for an electrical connection between the power module 410 and another device.

In an embodiment, the second circuit board 460, the first circuit board 450, the capacitor module 400, and the power module 410 are jointly configured to implement power conversion in the inverter apparatus 4.

Figure 20:
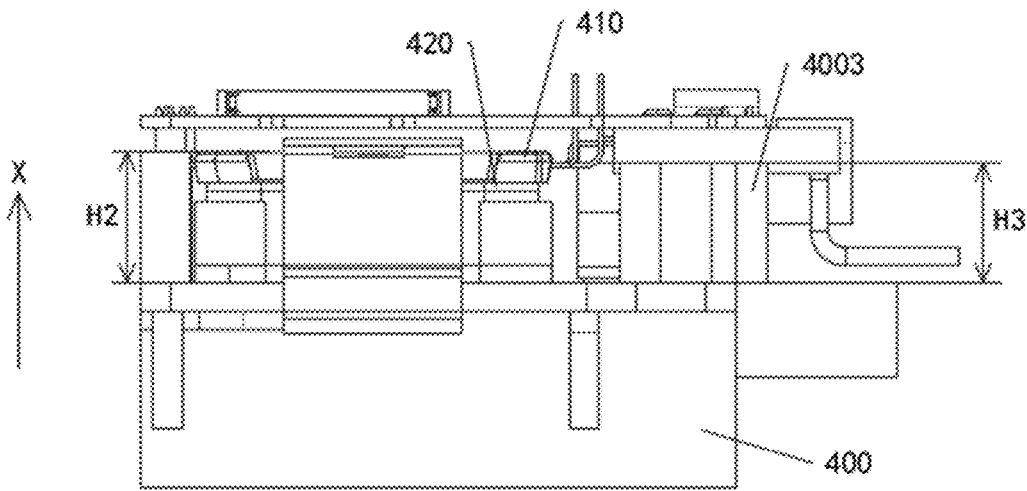
FIG. 20 is a schematic diagram of a structure of an inverter apparatus according to an embodiment of this application.

Refer to FIG. 19 and FIG. 20. FIG. 20 is a schematic diagram of a structure of an inverter apparatus 4 provided in an embodiment of this application. In an embodiment, the upper surface of the capacitor module 400 includes a plurality of second support columns 4003, the inverter apparatus 4 includes the second circuit board 460 (as shown in FIG. 19), and the plurality of second support columns 4003 are configured to fasten the second circuit board 460 and the capacitor module 400 (as shown in FIG. 19). In the direction in which the power module 410 and the first heat sink 420 are stacked, a height of each of the second support columns 4003 is less than a stacked height of the power module 410 and the first heat sink 420 (as shown in FIG. 20). In this embodiment, because the first heat sink 420 is located between the second circuit board 460 and the capacitor module 400 in the first direction X, the second circuit board 460 cannot be directly and fastened to the mounting surface 4000 of the capacitor module 400. Therefore, the second support columns 4003 are disposed on the mounting surface 4000, so as to compensate for a spacing between the second circuit board 460 and the mounting surface 4000. The height of the second support column 4003 is H3. Because the second circuit board 460 is located between the first circuit board 450 and the capacitor module 400 in the first direction X, H3≤H2 is set in this solution, so that the second support column 4003 can more smoothly fasten the second circuit board 460 and the capacitor module 400 together, thereby reducing mounting difficulty.

Figure 21:
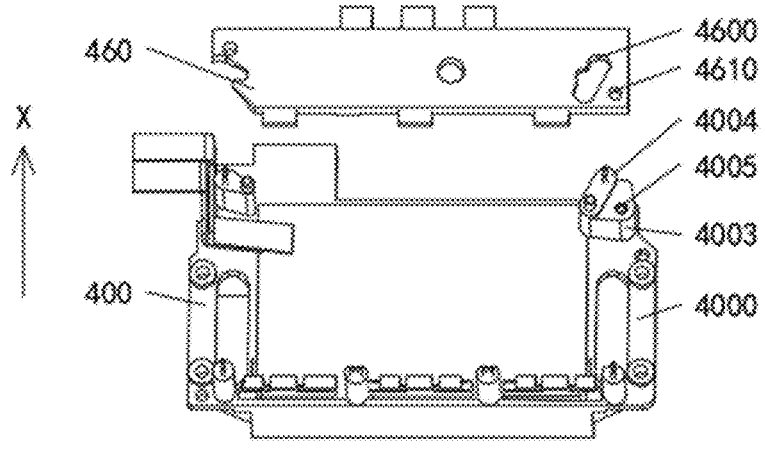
FIG. 21 is a schematic diagram of structures of a capacitor module and a second circuit board according to an embodiment of this application.

Refer to FIG. 21. FIG. 21 is a schematic diagram of structures of a capacitor module 400 and a second circuit board 460 provided in an embodiment of this application. The plurality of second support columns 4003 are sequentially arranged along the other side of the first heat sink 420, and orthographic projections of the plurality of second support columns 4003 and the first heat sink 420 on the upper surface of the capacitor module 400 do not overlap.

In this embodiment, the second support column 4003 is located on a side that is of the mounting surface 4000 and that is opposite to the first support column 4002. Because the first heat sink 420 is located between the second circuit board 460 and the capacitor module 400 in the first direction X, the following setting is performed: Projections of the second support columns 4003 and the first heat sink 420 in the first direction X do not overlap, so that the second circuit board 460 is not blocked by the first heat sink 420 in a process of fixedly connecting to the capacitor module 400 by using the second support columns 4003.

In an embodiment, a support column positioning part 4004 and a support column fixing hole 4005 are provided on the second support column 4003. A second circuit board positioning hole 4600 and a second circuit board fixing hole 4610 are respectively provided in the second circuit board 460 in correspondence with the support column positioning part 4004 and the support column fixing hole 4005 in the first direction X. The support column positioning part 4004 runs through the second circuit board positioning hole 4600 to implement a positioning function, and then the support column fixing hole 4005 and the second circuit board fixing hole 4610 are sequentially connected through a screw, so as to fasten the second support column 4003 and the second circuit board 460.

In an embodiment, the second support columns 4003 and the capacitor housing 4010 are integrally formed. In this solution, a connection between the second circuit board 460 and the capacitor module 400 is more stable. This is conducive to improving stability of an overall structure of the inverter apparatus 4.

Figure 22:
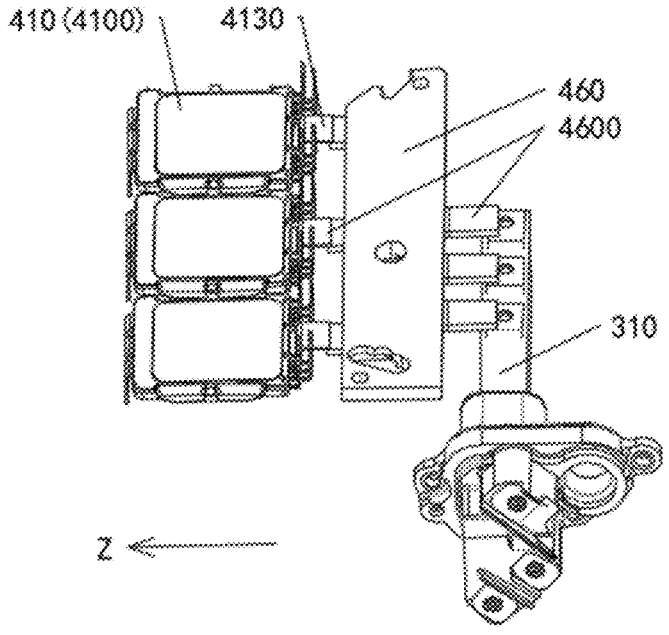
FIG. 22 is a schematic diagram of a partial structure of an inverter apparatus according to an embodiment of this application.

Refer to FIG. 22. FIG. 22 is a schematic diagram of a partial structure of an inverter apparatus 4 provided in an embodiment of this application. In an embodiment, there are a plurality of copper bar connectors 4600 between a surface that is of the second circuit board 460 and that faces the capacitor module 400 and the upper surface of the capacitor module 400. Each of the copper bar connectors 4600 is electrically connected to one of the power transistors 4100.

In this embodiment, two ends of the copper bar connector 4600 extend to two sides of the second circuit board 460 in the third direction Z. The power module 410 includes a second power terminal 4130, the second power terminal 4130 is electrically connected to the power transistor 4100, and the second power terminal 4130 is an output terminal of the power module 410. The copper bar connector 4600 is electrically connected to the second power terminal 4130 and a three-phase copper bar assembly 310 separately. The power module 410 is electrically connected to the three-phase copper bar assembly 310 through the second circuit board 460. The direct current transmitted by the capacitor module 400 is converted into the alternating current through the power module 410, and then the alternating current is sequentially transmitted to the motor sequentially through the second circuit board 460 and the three-phase copper bar assembly 310.

Figure 23:
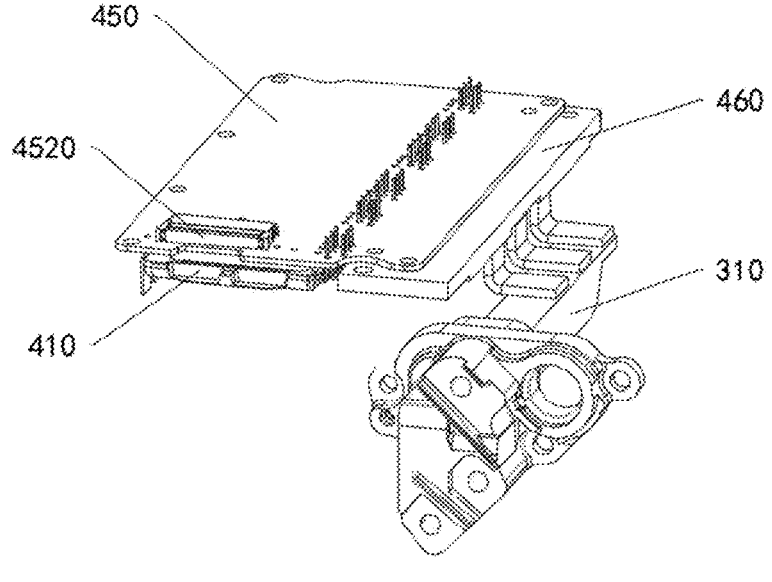
FIG. 23 is a schematic diagram of a partial structure of an inverter apparatus according to an embodiment of this application.

Refer to FIG. 23. FIG. 23 is a schematic diagram of a partial structure of an inverter apparatus 4 provided in an embodiment of this application. In an embodiment, a signal interface 4520 is disposed on the first circuit board 450, and the signal interface 4520 is configured to electrically connect to an external controller, and is configured to receive an external control signal to control the power module 410 to convert a parameter of the alternating current.

Figure 24:
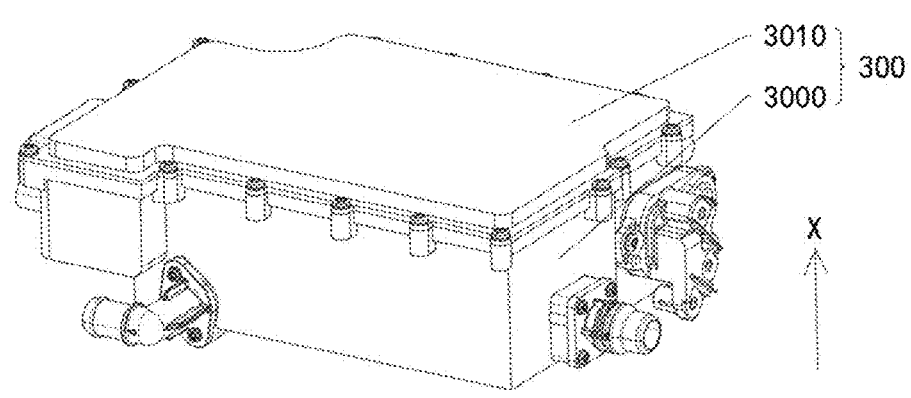
FIG. 24 is a schematic diagram of an overall structure of a motor controller according to an embodiment of this application.
Figure 25:
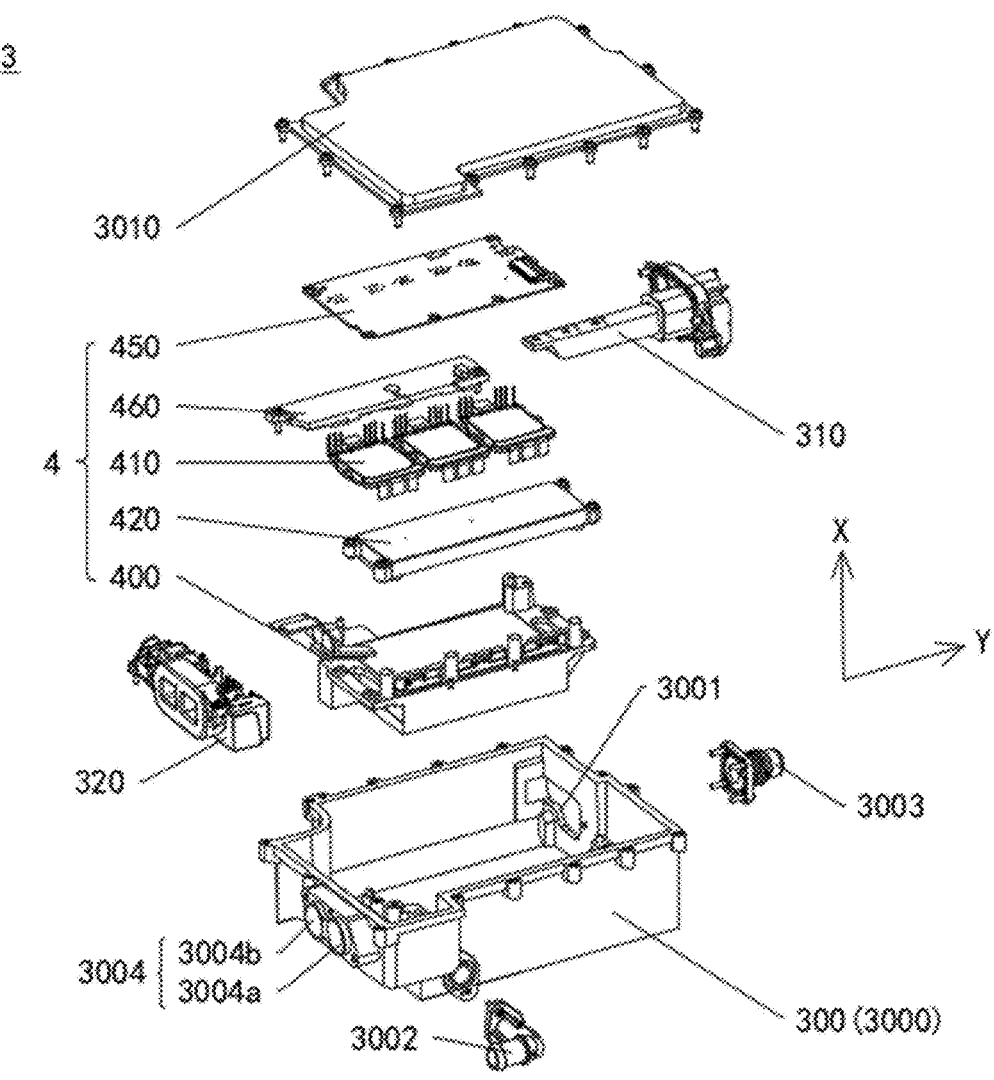
FIG. 25 is an exploded view of a motor controller according to an embodiment of this application.

Refer to FIG. 24 and FIG. 25. FIG. 24 is a schematic diagram of an overall structure of a motor controller 3 provided in an embodiment of this application. FIG. 25 is an exploded view of a motor controller 3 provided in an embodiment of this application. In an embodiment, the motor controller 3 includes the motor controller housing 300, the inverter apparatus 4, and the three-phase copper bar assembly 310 (as shown in FIG. 25), and the motor controller housing 300 is configured to accommodate the inverter apparatus 4 and the three-phase copper bar assembly 310. The motor controller housing 300 includes a bottom housing 3000 and a cover plate 3010 (as shown in FIG. 24), the inverter apparatus 4 is disposed between the bottom housing 3000 and the cover plate 3010 (as shown in FIG. 25), and the capacitor module 400 is fastened to the bottom housing 3000. The inverter apparatus 4 and the three-phase copper bar assembly 310 are arranged in parallel in the motor controller housing 300 in a direction perpendicular to the direction in which the power module 410 and the first heat sink 420 are stacked (as shown in FIG. 25).

In this embodiment, the cover plate 3010 is located on a side that is of the inverter apparatus 4 and the three-phase copper bar assembly 310 and that is away from the bottom housing 3000 in the first direction X. The cover plate 3010 and the bottom housing 3000 are fastened and form accommodation space through enclosure. One end of the three-phase copper bar assembly 310 and the inverter apparatus 4 are located in the accommodation space. The motor controller housing 300 is configured to: protect internal devices and isolate the internal devices from an external environment.

In an embodiment, the capacitor module 400 is fastened to the bottom housing 3000, so that the first heat sink 420 and the power module 410 that are fastened to the capacitor module 400 are also fastened to the bottom housing 3000. When the motor controller 3 is affected by an external force, a fixed connection relationship enables the inverter apparatus 4 to be free from impact of an external environment.

In an embodiment, the first heat sink 420 is fastened to the bottom housing 3000, to fasten the capacitor module 400 between the bottom housing 3000 and the first heat sink 420.

In an embodiment, the inverter apparatus 4 and the three-phase copper bar assembly 310 are disposed side by side in a plane perpendicular to the first direction X. Because devices in the inverter apparatus 4 are disposed in a stacked manner in the first direction X, when the three-phase copper bar assembly 310 is fastened in the motor controller housing 300, a mounting operation of the inverter apparatus 4 is not affected.

Figure 26:
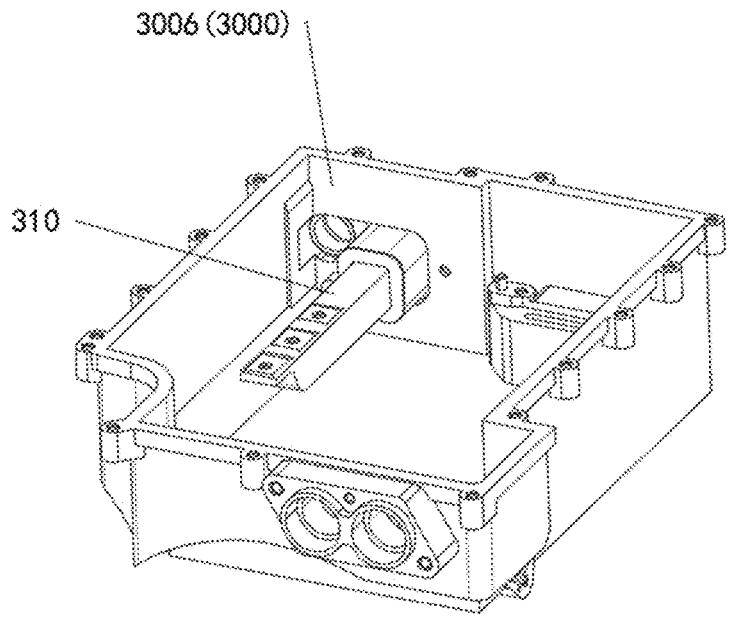
FIG. 26 is a schematic diagram of a partial structure of a motor controller according to an embodiment of this application.
Figure 27:
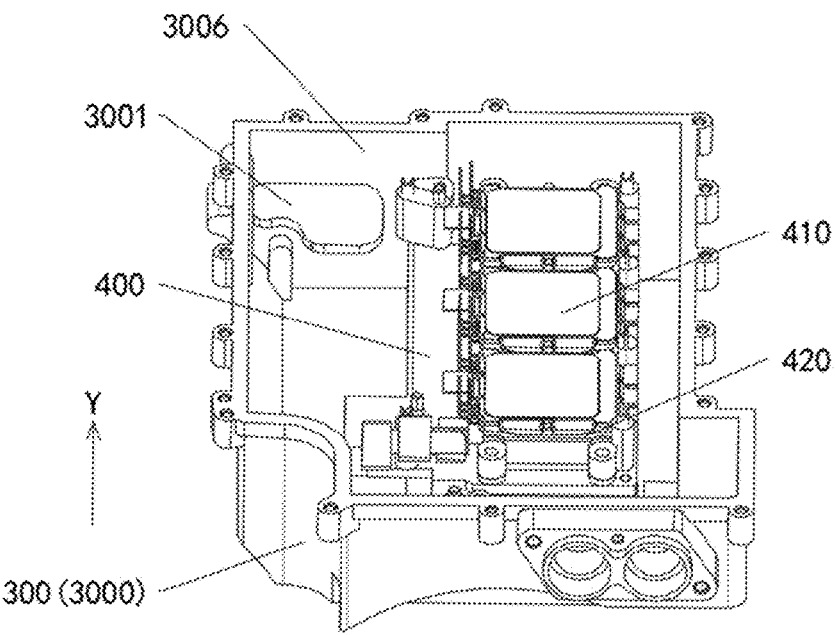
FIG. 27 is a schematic diagram of a partial structure of a motor controller according to an embodiment of this application.

Refer to FIG. 22, FIG. 26, and FIG. 27. FIG. 26 is a schematic diagram of a partial structure of a motor controller 3 provided in an embodiment of this application. FIG. 27 is a schematic diagram of a partial structure of a motor controller 3 provided in an embodiment of this application.

In an embodiment, a side wall 3006 of the motor controller housing 300 includes a copper bar assembly mounting hole 3001 (as shown in FIG. 27). One end of the three-phase copper bar assembly 310 extends into the bottom housing 3000 through the copper bar assembly mounting hole 3001, and is electrically connected to the plurality of power transistors 4100 by using a plurality of output copper bar connectors 4600 (as shown in FIG. 22 and FIG. 26). Orthographic projections of the copper bar assembly mounting hole 3001, the first heat sink 420, and the capacitor module 400 on a side wall 3006 do not overlap (as shown in FIG. 27).

In this embodiment, the three-phase copper bar assembly 310 runs through the copper bar assembly mounting hole 3001, and is fastened on an outer side of a side wall 3006 of the bottom housing 3000. Two ends of the three-phase copper bar assembly 310 in the second direction Y are electrically connected to the second circuit board 460 and the motor respectively (not shown). The power module 410 transmits the alternating current to the motor by using the second circuit board 460 and the three-phase copper bar assembly 310.

In this embodiment, projections of the copper bar assembly mounting hole 3001, the first heat sink 420, and the capacitor module 400 in the second direction Y do not overlap, so that projections of the three-phase copper bar assembly 310 and the capacitor module 400 in the second direction Y do not overlap. Because currents flowing through the capacitor module 400 and the three-phase copper bar assembly 310 are a direct current and an alternating current respectively, in this solution, a high-voltage direct current and a high-voltage alternating current in the motor controller 3 can be electrically shielded. This is conducive to improving electromagnetic compatibility of the motor controller 3.

Figure 28:
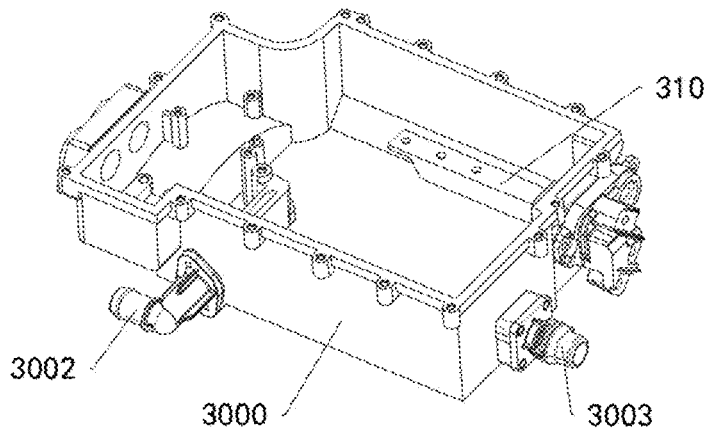
FIG. 28 is a schematic diagram of a partial structure of a motor controller according to an embodiment of this application.

Refer to FIG. 28. FIG. 28 is a schematic diagram of a partial structure of a motor controller 3 provided in an embodiment of this application. In an embodiment, the bottom housing 3000 includes a cooling liquid inlet 3002 and a cooling liquid outlet 3003. The cooling liquid outlet 3003 and the three-phase copper bar assembly 310 are located on a same side of the inverter apparatus 4, and one end of the cooling liquid inlet 3002 and one end of the cooling liquid outlet 3003 communicate with an external cooling system. The bottom housing 3000 further includes a housing waterway (not shown). The cooling liquid enters the housing waterway from the cooling liquid inlet 3002, then flows through the first heat sink 420, exchanges heat with the power module 410 and the capacitor module 400, and finally flows out of the motor controller 3 from the cooling liquid outlet 3003. In this embodiment, the cooling liquid outlet 3003 and the three-phase copper bar assembly 310 are disposed on the same side of the inverter apparatus 4, so that the inverter apparatus 4 has a more compact structure and mounting on the same side is facilitated.

In some embodiments, the cooling liquid outlet 3003 and the three-phase copper bar assembly 310 are disposed on different sides of the inverter apparatus 4, and may be disposed as required.

Figure 29:
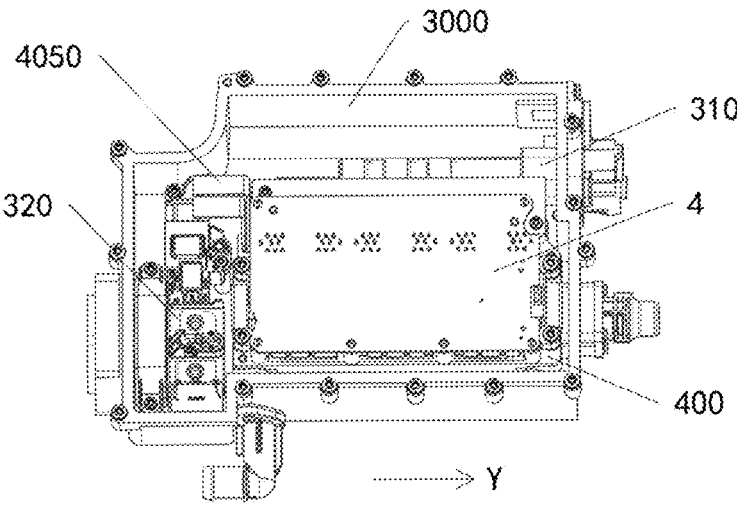
FIG. 29 is a schematic diagram of a partial structure of a motor controller according to an embodiment of this application.

With reference to FIG. 25 and FIG. 29, FIG. 29 is a schematic diagram of a partial structure of a motor controller 3 provided in an embodiment of this application. In an embodiment, the motor controller 3 further includes a direct current filter 320. The direct current filter 320 is configured to: receive the direct current, filter the direct current, and transmit the filtered direct current to the capacitor module 400. The direct current filter 320 and the three-phase copper bar assembly 310 are located on different sides of the inverter apparatus 4.

In this embodiment, the direct current filter 320 is fastened to the bottom housing 3000. The capacitor module 400 includes a capacitor module copper bar assembly 4050. The capacitor module copper bar assembly 4050 is located on a side of the capacitor module 400 in the second direction Y. The direct current filter 320 is electrically connected to the capacitor module 400 by using the capacitor module copper bar assembly 4050. The direct current filter 320 and the capacitor module 400 are used in a cooperative manner to perform filtering processing on the direct current input to the motor controller 3. The direct current filter 320 is located on a side of the inverter apparatus 4 in the second direction Y, and the three-phase copper bar assembly 310 is located on the other side of the inverter apparatus 4 in the second direction Y. This is conducive to reducing electrical interference generated between the direct current filter 320 and the three-phase copper bar assembly 310.

Still refer to FIG. 25. In an embodiment, a direct current input interface 3004 is disposed on a side that is outside the bottom housing 3000 and that is close to the direct current filter 320. The direct current input interface 3004 and the direct current filter 320 are correspondingly disposed in the second direction Y. The direct current input interface 3004 is configured to electrically connect to the power battery 21.

In this embodiment, the direct current input interface 3004, the cooling liquid outlet 3003, and the copper bar assembly mounting hole 3001 are located on two opposite sides of the bottom housing 3000 in the second direction Y. The direct current transmitted by the power battery 21 is transmitted to the direct current filter 320 and the capacitor module 400 through the direct current input interface 3004, and the direct current filter 320 and the capacitor module 400 are configured to filter harmonics in the direct current. In an embodiment, the direct current input interface 3004 includes a first direct current interface 3004_a_ and a second direct current interface 3004_b_. The first direct current interface 3004_a_ and the second direct current interface 3004_b_ are electrically connected to a positive electrode and a negative electrode of the power battery respectively.

In this embodiment of this application, the inverter apparatus 4 integrates the capacitor module 400, the first heat sink 420, and the power module 410, and integrates the first circuit board 450 and the second circuit board 460, so that the inverter apparatus 4 is modularized. This is conducive to simplifying a mounting process of the motor controller 3, implementing quick assembly and disassembly of the motor controller 3, and reducing operation difficulty and costs. In addition, the capacitor module 400, the first heat sink 420, the power module 410, and the first circuit board 450 are disposed and fastened in a stacked manner in a perpendicular direction, so that the motor controller 3 is more miniaturized, thereby helping optimize an entire vehicle layout.

Figure 30:
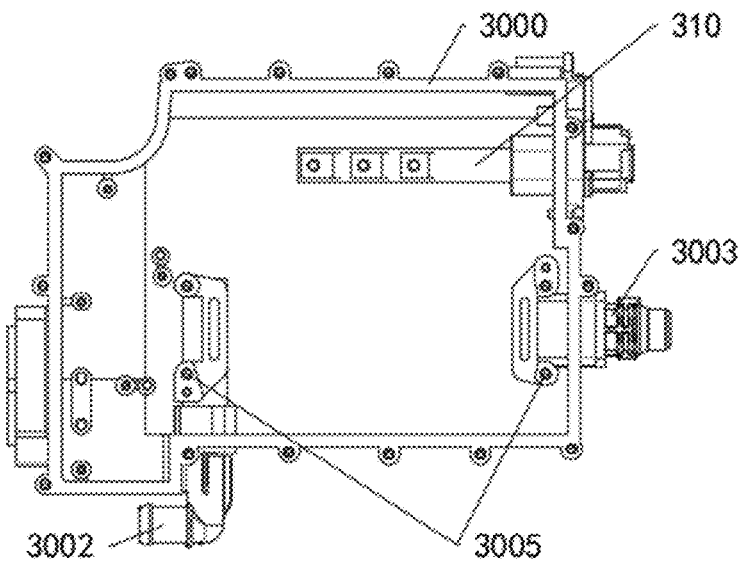
FIG. 30 is a schematic diagram of a partial structure of a motor controller according to an embodiment of this application.

Still refer to FIG. 25 to FIG. 28 and FIG. 30. FIG. 30 is a schematic diagram of a partial structure of a motor controller 3 provided in an embodiment of this application. In an embodiment, the inverter apparatus 4 integrates the capacitor module 400, the first heat sink 420, and the power module 410, and integrates the first circuit board 450 and the second circuit board 460. An assembly manner of the motor controller 3 is as follows.

First, the three-phase copper bar assembly 310 extends into an inner side of the bottom housing 3000 through the copper bar assembly mounting hole 3001.

Then, the direct current filter 320 is disposed. The direct current filter 320 is disposed in the bottom housing 3000.

Next, the inverter apparatus 4 is disposed in the bottom housing 3000, and is fastened to a fastener 3005 in the bottom housing 3000 in a threaded connection manner with screws running through screw holes (the second fasteners 4200) of the first heat sink 420 and positioning holes (the first fasteners 4001) in the capacitor module 400, so that the inverter apparatus 4 is fastened to the bottom housing 3000. In an embodiment, a mounting leg may alternatively be added to a side edge of the housing of the capacitor module 400, and is fastened to the bottom housing 3000 through a screw. After the inverter apparatus 4 is disposed, the second circuit board 460 is lapped with and electrically connected to the three-phase copper bar assembly 310, and the capacitor module copper bar assembly 4050 of the capacitor module 400 is lapped with and electrically connected to an output terminal of the direct current filter 320.

Finally, the cover plate 3010 is used to cover the bottom housing 3000 and the cover plate 3010 is fastened to the bottom housing 3000. The mounting is completed.

The foregoing describes in detail the inverter apparatus, the motor controller, and the vehicle provided in embodiments of this application. Examples are used in this specification to describe the principles and embodiments of this application. The descriptions of the foregoing embodiments are merely intended to help understand the method of this application and the core ideas of the method. In addition, a person of ordinary skill in the art may change the example embodiments and the application scope based on the ideas of this application. To sum up, the content of this specification shall not be construed as a limitation on this application.

What is claimed is:

1. An inverter apparatus used in a motor controller, the inverter apparatus comprising:

a capacitor module;

a power module;

and a first heat sink, wherein the power module and the first heat sink are disposed in a stacked manner on the capacitor module, and wherein the power module comprises a plurality of power transistors arranged in a flat manner in a direction perpendicular to a direction in which the power module and the first heat sink are stacked;

the capacitor module further comprises a plurality of capacitor connection terminals, each of the capacitor connection terminals is configured to connect to one of the power transistors, the plurality of capacitor connection terminals are arranged on an upper surface of the capacitor module along the first heat sink, orthographic projections of the capacitor connection terminals and the first heat sink on the upper surface of the capacitor module do not overlap, and the upper surface of the capacitor module is a surface that is of the capacitor module and that faces the first heat sink.

2. The inverter apparatus according to claim 1, wherein the first heat sink is disposed in a stacked manner on the capacitor module, the power module is disposed in a stacked manner on a side that is of the first heat sink and that is away from the capacitor module, and the plurality of power transistors are arranged in a flat manner on the side that is of the first heat sink and that is away from the capacitor module.

3. The inverter apparatus according to claim 1, wherein the inverter apparatus further comprises a sheet metal clip, two ends of the sheet metal clip are respectively clamped and fastened to the power module and the capacitor module, and the sheet metal clip is configured to fasten the power module, the first heat sink, and the capacitor module in the direction in which the power module and the first heat sink are stacked.

4. The inverter apparatus according to claim 1, wherein the inverter apparatus comprises a plurality of groups of first power terminals, each group of the first power terminals comprises at least one first power terminal, each of the first power terminals is configured to connect to one of the power transistors and the capacitor module, and the plurality of groups of first power terminals are sequentially arranged along a side of the first heat sink.

5. The inverter apparatus according to claim 1, wherein a metal connection layer is disposed between the first heat sink and the power module, the metal connection layer is fastened to both the first heat sink and the power module, and two surfaces that are of the metal connection layer and that are disposed opposite to each other in the direction in which the power module and the first heat sink are stacked are in contact with the first heat sink and the power module respectively.

6. The inverter apparatus according to claim 1, wherein the inverter apparatus comprises a first circuit board, the power module and the first heat sink are disposed in a stacked manner between the capacitor module and the first circuit board, and the first circuit board is electrically connected to the plurality of power transistors.

7. The inverter apparatus according to claim 1, wherein an upper surface of the capacitor module comprises a plurality of second support columns, the inverter apparatus comprises a second circuit board, and the plurality of second support columns are configured to fasten the second circuit board and the capacitor module, wherein in the direction in which the power module and the first heat sink are stacked, a height of each of the second support columns is less than a stacked height of the power module and the first heat sink; and the plurality of second support columns are sequentially arranged along the other side of the first heat sink, and orthographic projections of the plurality of second support columns and the first heat sink on the upper surface of the capacitor module do not overlap.

8. The inverter apparatus according to claim 2, wherein the inverter apparatus further comprises a second heat sink, and the second heat sink is disposed in a stacked manner on a side that is of the power module and that is away from the first heat sink.

9. The inverter apparatus according to claim 6, wherein an upper surface of the capacitor module comprises a plurality of first support columns, and the plurality of first support columns are configured to fasten the first circuit board and the capacitor module, wherein in the direction in which the power module and the first heat sink are stacked, a height of each of the first support columns is greater than or equal to a stacked height of the power module and the first heat sink; and the plurality of first support columns are sequentially arranged along a side of the first heat sink, and orthographic projections of the plurality of first support columns and the first heat sink on the upper surface of the capacitor module do not overlap.

10. The inverter apparatus according to claim 6, wherein the inverter apparatus comprises a second circuit board, and the second circuit board and the power module are disposed side by side between the capacitor module and the first circuit board.

11. The inverter apparatus according to claim 7, wherein there are a plurality of copper bar connectors between a surface that is of the second circuit board and that faces the capacitor module and the upper surface of the capacitor module, and each of the copper bar connectors is electrically connected to one of the power transistors.

12. A motor controller comprising:

a motor controller housing;

an inverter apparatus; and a three-phase copper bar assembly, wherein the motor controller housing is configured to accommodate the inverter apparatus and the three-phase copper bar assembly, and wherein the inverter apparatus comprises:

a capacitor module, a power module, and a first heat sink, wherein the power module and the first heat sink are disposed in a stacked manner on the capacitor module, and wherein:

the power module comprises a plurality of power transistors, and the plurality of power transistors are arranged in a flat manner in a direction perpendicular to a direction in which the power module and the first heat sink are stacked;

the capacitor module further comprises a plurality of capacitor connection terminals, each of the capacitor connection terminals is configured to connect to one of the power transistors, the plurality of capacitor connection terminals are arranged on an upper surface of the capacitor module along the first heat sink, orthographic projections of the capacitor connection terminals and the first heat sink on the upper surface of the capacitor module do not overlap, and the upper surface of the capacitor module is a surface that is of the capacitor module and that faces the first heat sink;

the motor controller housing comprises a bottom housing and a cover plate, the inverter apparatus is disposed between the bottom housing and the cover plate, and the capacitor module is fastened to the bottom housing; and the inverter apparatus and the three-phase copper bar assembly are arranged in parallel in the motor controller housing in a direction perpendicular to a direction in which the power module and the first heat sink are stacked.

13. The motor controller according to claim 12, wherein the first heat sink is disposed in a stacked manner on the capacitor module, the power module is disposed in a stacked manner on a side that is of the first heat sink and that is away from the capacitor module, and the plurality of power transistors are arranged in a flat manner on the side that is of the first heat sink and that is away from the capacitor module.

14. The motor controller according to claim 12, wherein the inverter apparatus further comprises a sheet metal clip, two ends of the sheet metal clip are respectively clamped and fastened to the power module and the capacitor module, and the sheet metal clip is configured to fasten the power module, the first heat sink, and the capacitor module in the direction in which the power module and the first heat sink are stacked.

15. The motor controller according to claim 12, wherein the inverter apparatus comprises a plurality of groups of first power terminals, each group of the first power terminals comprises at least one first power terminal, each of the first power terminals is configured to connect to one of the power transistors and the capacitor module, and the plurality of groups of first power terminals are sequentially arranged along a side of the first heat sink.

16. The motor controller according to claim 12, wherein a metal connection layer is disposed between the first heat sink and the power module, the metal connection layer is fastened to both the first heat sink and the power module, and two surfaces that are of the metal connection layer and that are disposed opposite to each other in the direction in which the power module and the first heat sink are stacked are in contact with the first heat sink and the power module respectively.

17. The motor controller according to claim 12, wherein a side wall of the motor controller housing comprises a copper bar assembly mounting hole, one end of the three-phase copper bar assembly extends into the bottom housing through the copper bar assembly mounting hole and is electrically connected to a plurality of power transistors through a plurality of output copper bar connectors, and orthographic projections of the copper bar assembly mounting hole, the first heat sink, and the capacitor module on the side wall do not overlap.

18. A vehicle comprising:
a motor; and
a motor controller comprising:
a motor controller housing;
an inverter apparatus; and
a three-phase copper bar assembly, wherein the motor controller housing is configured to accommodate the inverter apparatus and the three-phase copper bar assembly, and wherein the inverter apparatus comprises:
a capacitor module,
a power module,
and
a first heat sink, wherein the power module and the first heat sink are disposed in a stacked manner on the capacitor module, and wherein:
the power module comprises a plurality of power transistors, and the plurality of power transistors are arranged in a flat manner in a direction perpendicular to a direction in which the power module and the first heat sink are stacked;
the capacitor module further comprises a plurality of capacitor connection terminals, each of the capacitor connection terminals is configured to connect to one of the power transistors, the plurality of capacitor connection terminals are arranged on an upper surface of the capacitor module along the first heat sink, orthographic projections of the capacitor connection terminals and the first heat sink on the upper surface of the capacitor module do not overlap, and the upper surface of the capacitor module is a surface that is of the capacitor module and that faces the first heat sink;
the motor controller housing comprises a bottom housing and a cover plate, the inverter apparatus is disposed between the bottom housing and the cover plate, and the capacitor module is fastened to the bottom housing; and
the inverter apparatus and the three-phase copper bar assembly are arranged in parallel in the motor controller housing in a direction perpendicular to a direction in which the power module and the first heat sink are stacked; wherein the three-phase copper bar assembly is electrically connected to the motor.

* * * * *